US012266655B2

(12) United States Patent
Chen et al.

(10) Patent No.: US 12,266,655 B2
(45) Date of Patent: Apr. 1, 2025

(54) TRANSISTORS WITH RECESSED SILICON CAP AND METHOD FORMING SAME

(71) Applicant: Taiwan Semiconductor Manufacturing Co., Ltd., Hsinchu (TW)

(72) Inventors: Yen-Ting Chen, Taichung (TW); Bo-Yu Lai, Taipei (TW); Chien-Wei Lee, Kaohsiung (TW); Hsueh-Chang Sung, Zhubei (TW); Wei-Yang Lee, Taipei (TW); Feng-Cheng Yang, Zhudong Township (TW); Yen-Ming Chen, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/657,833

(22) Filed: Apr. 4, 2022

(65) Prior Publication Data
US 2022/0223591 A1   Jul. 14, 2022

Related U.S. Application Data

(62) Division of application No. 16/429,253, filed on Jun. 3, 2019, now Pat. No. 11,296,077.
(Continued)

(51) Int. Cl.
*H01L 27/088* (2006.01)
*H01L 21/02* (2006.01)
(Continued)

(52) U.S. Cl.
CPC .... *H01L 27/0886* (2013.01); *H01L 21/02068* (2013.01); *H01L 21/02532* (2013.01);
(Continued)

(58) Field of Classification Search
CPC ............ H01L 29/161; H01L 29/66545; H01L 29/1054; H01L 29/165; H01L 29/785;
(Continued)

(56) References Cited

U.S. PATENT DOCUMENTS 8,962,400 B2   2/2015   Tsai et al.
9,093,514 B2   7/2015   Tsai et al.
(Continued)

FOREIGN PATENT DOCUMENTS

CN   102983165 A   3/2013
KR   101371841 B1   3/2014
(Continued)

*Primary Examiner* — Vongsavanh Sengdara
(74) *Attorney, Agent, or Firm* — Slater Matsil, LLP

(57) ABSTRACT

A method includes forming a semiconductor fin protruding higher than top surfaces of isolation regions. A top portion of the semiconductor fin is formed of a first semiconductor material. A semiconductor cap layer is formed on a top surface and sidewalls of the semiconductor fin. The semiconductor cap layer is formed of a second semiconductor material different from the first semiconductor material. The method further includes forming a gate stack on the semiconductor cap layer, forming a gate spacer on a sidewall of the gate stack, etching a portion of the semiconductor fin on a side of the gate stack to form a first recess extending into the semiconductor fin, recessing the semiconductor cap layer to form a second recess directly underlying a portion of the gate spacer, and performing an epitaxy to grow an epitaxy region extending into both the first recess and the second recess.

20 Claims, 23 Drawing Sheets

Related U.S. Application Data

(60) Provisional application No. 62/769,386, filed on Nov. 19, 2018.

(51) Int. Cl.
*H01L 21/3065* (2006.01)
*H01L 21/8234* (2006.01)
*H01L 29/06* (2006.01)
*H01L 29/161* (2006.01)
*H01L 29/66* (2006.01)
*H01L 29/78* (2006.01)

(52) U.S. Cl.
CPC .. *H01L 21/3065* (2013.01); *H01L 21/823431* (2013.01); *H01L 21/823437* (2013.01); *H01L 21/823481* (2013.01); *H01L 29/0642* (2013.01); *H01L 29/161* (2013.01); *H01L 29/66545* (2013.01); *H01L 29/66795* (2013.01); *H01L 29/785* (2013.01)

(58) Field of Classification Search
CPC ........... H01L 29/0642; H01L 29/66795; H01L 21/02068; H01L 21/02532; H01L 21/823437; H01L 21/3065; H01L 21/823431; H01L 21/823481; H01L 27/0886
See application file for complete search history.

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,318,322 B2 | 4/2016 | Wu et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,704,993 B2 | 7/2017 | Basker et al. | |
| 9,812,363 B1 | 11/2017 | Liao et al. | |
| 9,859,380 B2 | 1/2018 | Lee et al. | |
| 9,947,663 B2 | 4/2018 | Basker et al. | |
| 9,991,262 B1* | 6/2018 | Ching | H01L 21/823821 |
| 10,037,923 B1 | 7/2018 | Lee et al. | |
| 10,658,247 B2 | 5/2020 | Chiang et al. | |
| 11,127,586 B2 | 9/2021 | Chang et al. | |
| 2011/0068407 A1 | 3/2011 | Yeh et al. | |
| 2012/0012932 A1 | 1/2012 | Perng et al. | |
| 2013/0049068 A1 | 2/2013 | Lin et al. | |
| 2013/0056795 A1 | 3/2013 | Wu et al. | |
| 2013/0175638 A1 | 7/2013 | Ho et al. | |
| 2013/0228830 A1 | 9/2013 | Lee et al. | |
| 2013/0248948 A1 | 9/2013 | Ma et al. | |
| 2013/0270638 A1 | 10/2013 | Adam et al. | |
| 2015/0311340 A1 | 10/2015 | Ma et al. | |
| 2016/0027918 A1* | 1/2016 | Kim | H01L 29/7848 257/401 |
| 2016/0079078 A1 | 3/2016 | Asano | |
| 2016/0204199 A1* | 7/2016 | Yin | H01L 29/161 257/190 |
| 2016/0322462 A1 | 11/2016 | Chou et al. | |
| 2017/0005011 A1* | 1/2017 | Ching | H01L 27/0922 |
| 2017/0294522 A1 | 10/2017 | Pandey et al. | |
| 2018/0175165 A1* | 6/2018 | Lim | H01L 29/42376 |

FOREIGN PATENT DOCUMENTS

| | | |
|---|---|---|
| KR | 20160099537 A | 8/2016 |
| KR | 20160147626 A | 12/2016 |
| TW | 201712762 A | 4/2017 |
| TW | 201735152 A | 10/2017 |
| TW | 201812853 A | 4/2018 |
| TW | I621170 B | 4/2018 |
| TW | I641135 B | 11/2018 |

* cited by examiner

TRANSISTORS WITH RECESSED SILICON CAP AND METHOD FORMING SAME

PRIORITY CLAIM AND CROSS-REFERENCE

This application is a divisional of U.S. patent application Ser. No. 16/429,253, entitled "Transistors with Recessed Silicon Cap and Method Forming Same," and filed Jun. 3, 2019, which claims the benefit of U.S. Provisional Application No. 62/769,386 filed on Nov. 19, 2018, entitled "Transistors with Recessed Silicon Cap and Method Forming Same," which applications are hereby incorporated herein by reference.

BACKGROUND

Transistors are basic building elements in integrated circuits. In previous development of the integrated circuits, Fin Field-Effect Transistors (FinFETs) are formed to replace planar transistors. In the formation of FinFETs, semiconductor fins are formed, and dummy gates are formed on the semiconductor fins. Gate spacers are formed on the sidewalls of the dummy gate stacks. The dummy gate stacks are then removed to form trenches between the gate spacers. Replacement gates are then formed in the trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
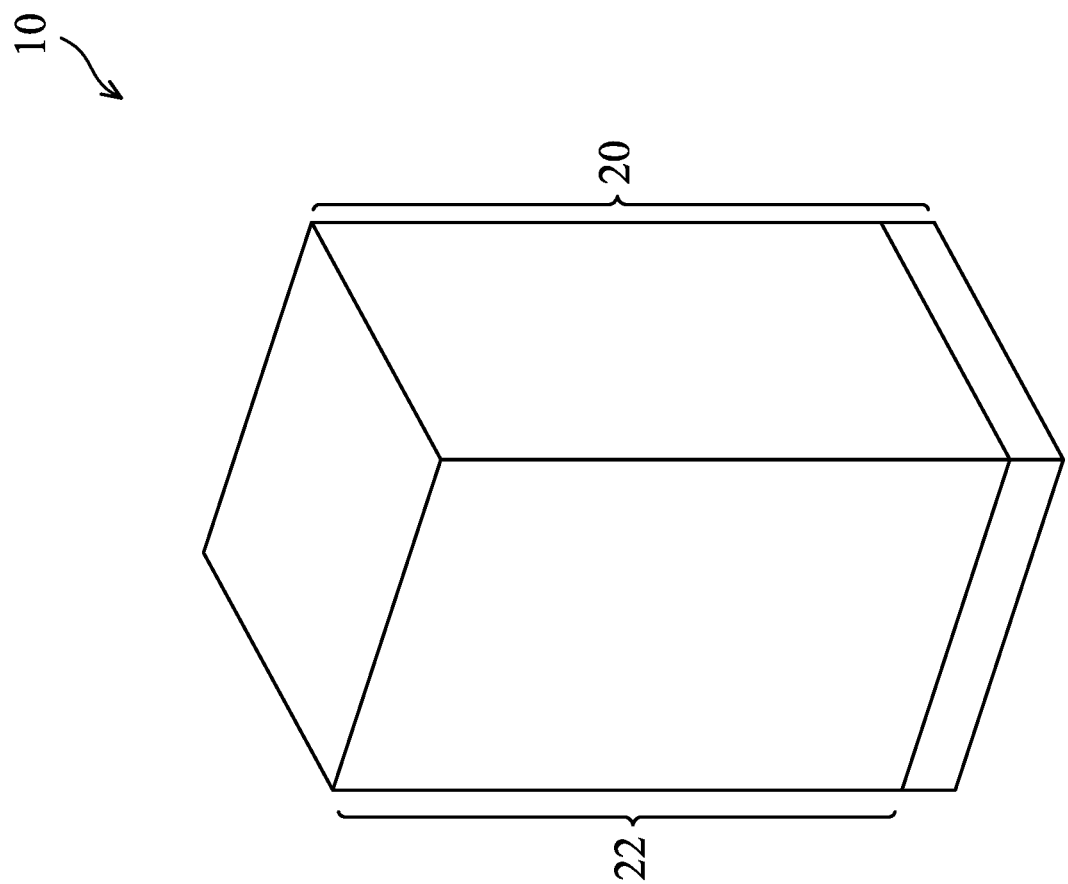
FIGS. 1 through 8, 9A, 9B, 9C, 9D, 10A, 10B, 10C, 10D, 11, 12A, 12B, 12C, 12D, and 13 illustrate the cross-sectional views and perspective views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor and the method of forming the same are provided in accordance with various embodiments. The intermediate stages in the formation of the transistor are illustrated in accordance with some embodiments. Some variations of some embodiments are discussed. Throughout the various views and illustrative embodiments, like reference numbers are used to designate like elements. In accordance with some embodiments of the present disclosure, a silicon cap layer is formed on a semiconductor fin, and is recessed before the epitaxial growth of source/drain regions, so that the interface area between the epitaxy source/drain regions and the channel region is increased. The current crowding is thus reduced. It is appreciated that although Fin Field-Effect Transistors (FinFETs) are used as example embodiments to discuss the concepts of the present disclosure, the concept of the present disclosure is readily applicable on other types of transistors such as planar transistors.

FIGS. 1 through 8, 9A, 9B, 9C, 9C 10A, 10B, 10C, 10D, 11, 12A, 12B, 12C, 12D, and 13 illustrate the cross-sectional views and perspective views of intermediate stages in the formation of a Fin Field-Effect Transistor (FinFET) in accordance with some embodiments. The processes shown in these figures are also reflected schematically in the process flow 200 as shown in FIG. 14.

In FIG. 1, substrate 20, which is a part of wafer 10, is provided. The substrate 20 may be a semiconductor substrate such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 as shown in FIG. 14. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
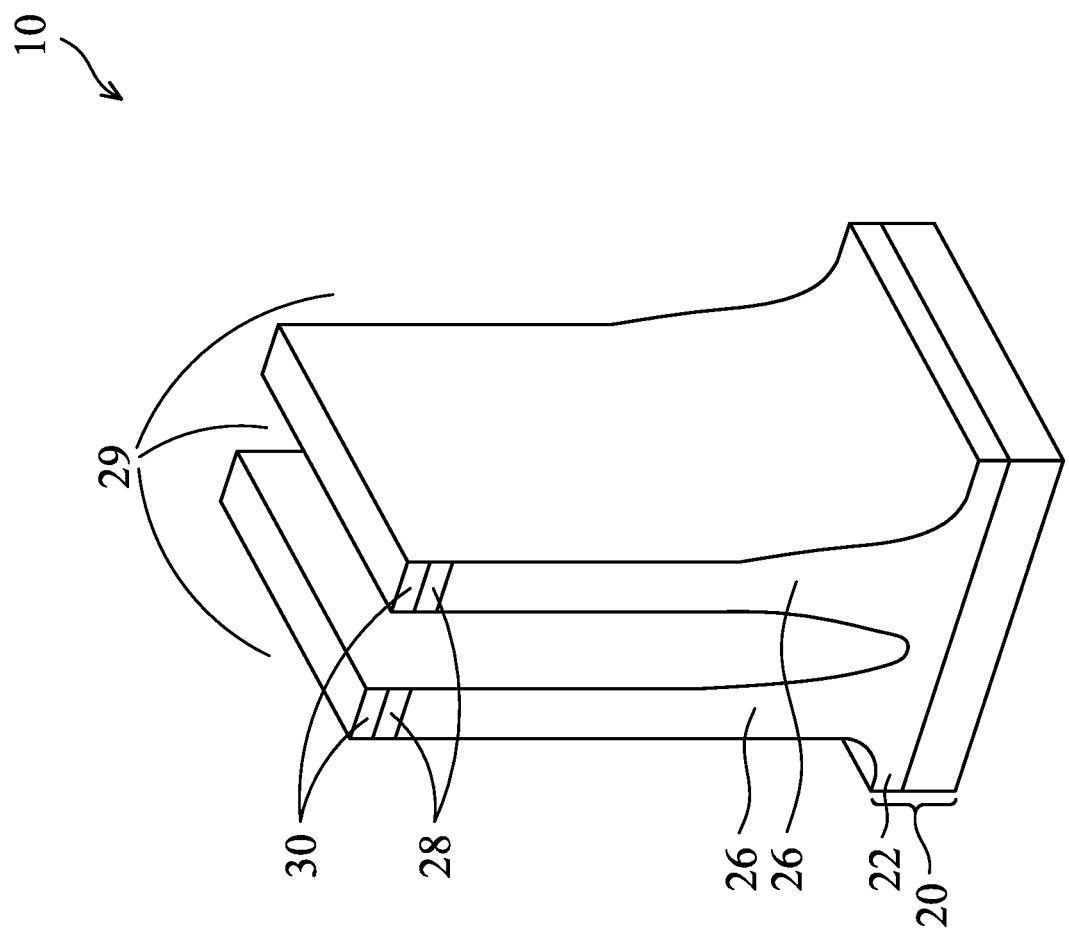

Referring to FIG. 2, recesses 29 are formed to extend from a top surface of substrate 20 into substrate 20. To form recesses 29, pad oxide layer 28 and hard mask layer 30 are first formed and patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form the pattern as shown in FIG. 2.

Next, the patterned hard mask layer 30 is used as an etching mask to etch pad oxide layer 28 and semiconductor substrate 20. Recesses 29 are thus formed extending into semiconductor substrate 20. The respective process is illustrated as process 204 in the process flow 200 as shown in FIG. 14. In accordance with some embodiments of the present disclosure, the bottoms of recesses 29 are higher than the bottom surface of well region 22. The portions of semiconductor substrate 20 between neighboring recesses 29 are referred to as semiconductor strips 26 hereinafter. The portions of semiconductor substrate 20 lower than the bottoms of recesses 29 are referred to as semiconductor substrate 20.

Figure 3:
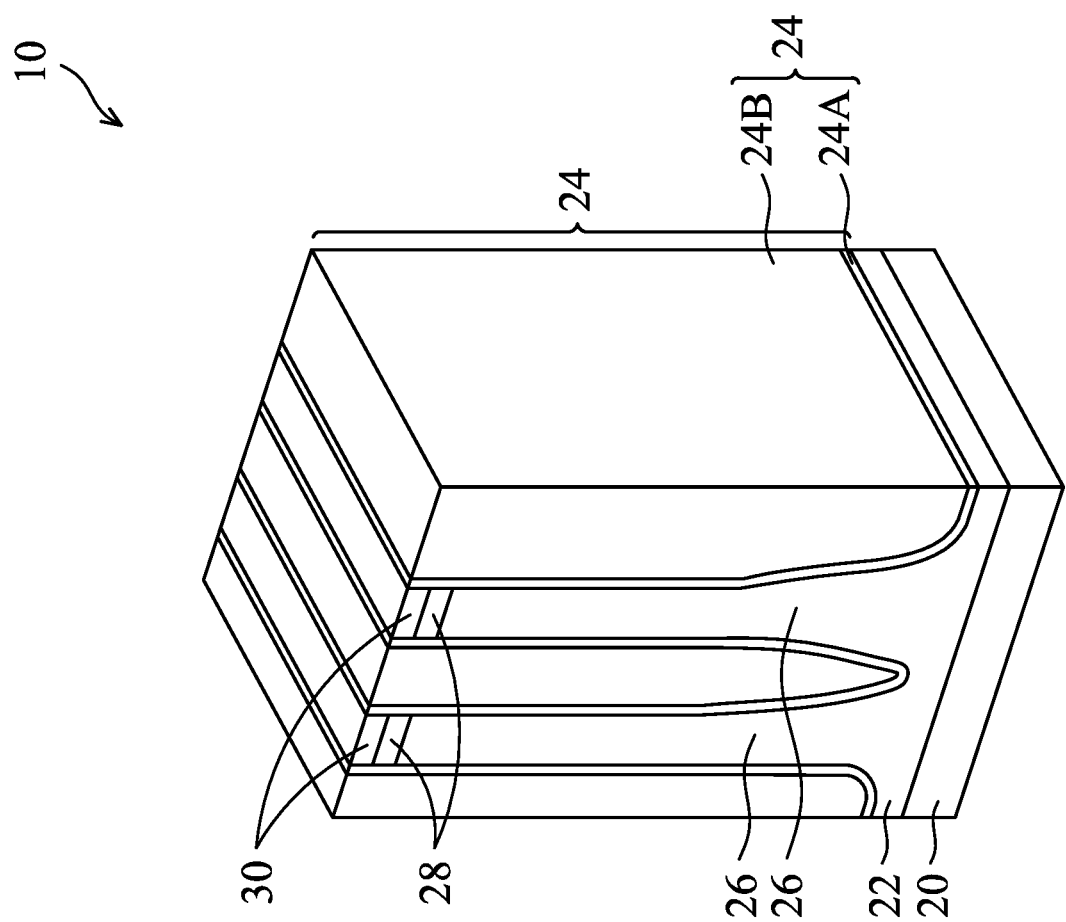

Trenches 29 are then filled with a dielectric material(s), as shown in FIG. 3. A planarization process such as a Chemical Mechanical Polish (CMP) process or a mechanical grinding process is performed to remove excessing portions of the dielectric materials, and the remaining portions of the dielectric materials(s) are referred to as STI regions 24. The respective process is illustrated as process 206 in the process flow 200 as shown in FIG. 14. STI regions 24 may include liner dielectric 24A, which may be a thermal oxide formed through a thermal oxidation of a surface layer of substrate 20. The liner dielectric may also be a deposited dielectric layer such as a silicon oxide layer, a silicon nitride layer, or the like. The formation method may include Atomic Layer Deposition (ALD), High-Density Plasma Chemical Vapor Deposition (HDPCVD), Chemical Vapor Deposition (CVD), or the like. STI regions 24 may also include dielectric material 24B over the liner dielectric 24A, wherein the dielectric material 24B may be formed using Flowable Chemical Vapor Deposition (FCVD), spin-on coating, or the like. Dielectric material 24B may include silicon oxide in accordance with some embodiments.

Figure 4:
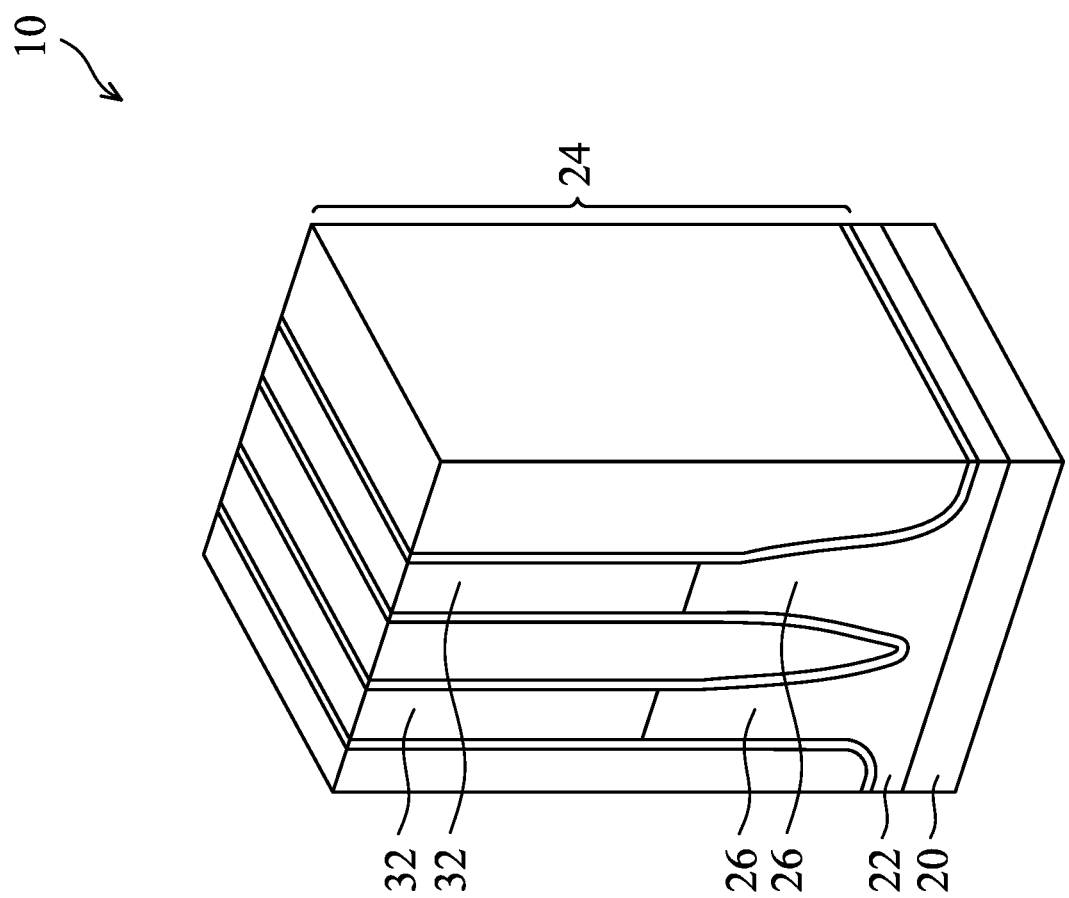

The top surfaces of hard masks 30 and the top surfaces of STI regions 24 may be substantially level with each other. Semiconductor strips 26 are between neighboring STI regions 24. In accordance with some embodiments of the present disclosure, the top portions of semiconductor strips 26 are replaced by another semiconductor material different from that of semiconductor strips 26, so that semiconductor strips 32 are formed, as shown in FIG. 4. The formation of semiconductor strips 32 may include etching the top portions of semiconductor strips 26 to form recesses, and performing an epitaxy process to regrow another semiconductor material in the recesses. A planarization process such as a Chemical Mechanical Polish (CMP) process or a mechanical grinding process is then performed to remove excess portions of the epitaxy semiconductor material higher than STI regions 24, and the remaining portions of the semiconductor material form semiconductor strips 32. Accordingly, semiconductor strips 32 are formed of a semiconductor material different from that of substrate 20. In accordance with some embodiments, semiconductor strips 32 are formed of silicon germanium, silicon carbon, or a III-V compound semiconductor material. In accordance with some embodiments of the present disclosure in which semiconductor strips 32 are formed of or comprise silicon germanium, the germanium atomic percentage may be higher than about 30 percent, and may be in the range between about 30 percent and about 100 percent.

In accordance with some embodiments of the present disclosure, semiconductor strips 32 are in-situ doped with an impurity of a same conductivity type as well region 22 during the epitaxy. Furthermore, the in-situ doped impurity may have a concentration in a same range as well region 22. For example, the n-type or p-type impurity concentration may be equal to or less than $10^{18}$ cm$^{-3}$, such as in the range between about $10^{17}$ cm$^{-3}$ and about $10^{18}$ cm$^{-3}$. In accordance with alternative embodiments of the present disclosure, the implantation process for the formation of well region 22, instead of being performed in the process shown in FIG. 1, may be performed after semiconductor strips 32 is formed.

In accordance with other embodiments of the present disclosure, no replacement process is performed to replace the top portions of semiconductor strips 26 with another material, and the illustrated semiconductor strips 26 are parts of the original substrate 20, and hence the material of semiconductor strips 26 and 32 are the same as that of substrate 20.

Figure 5:
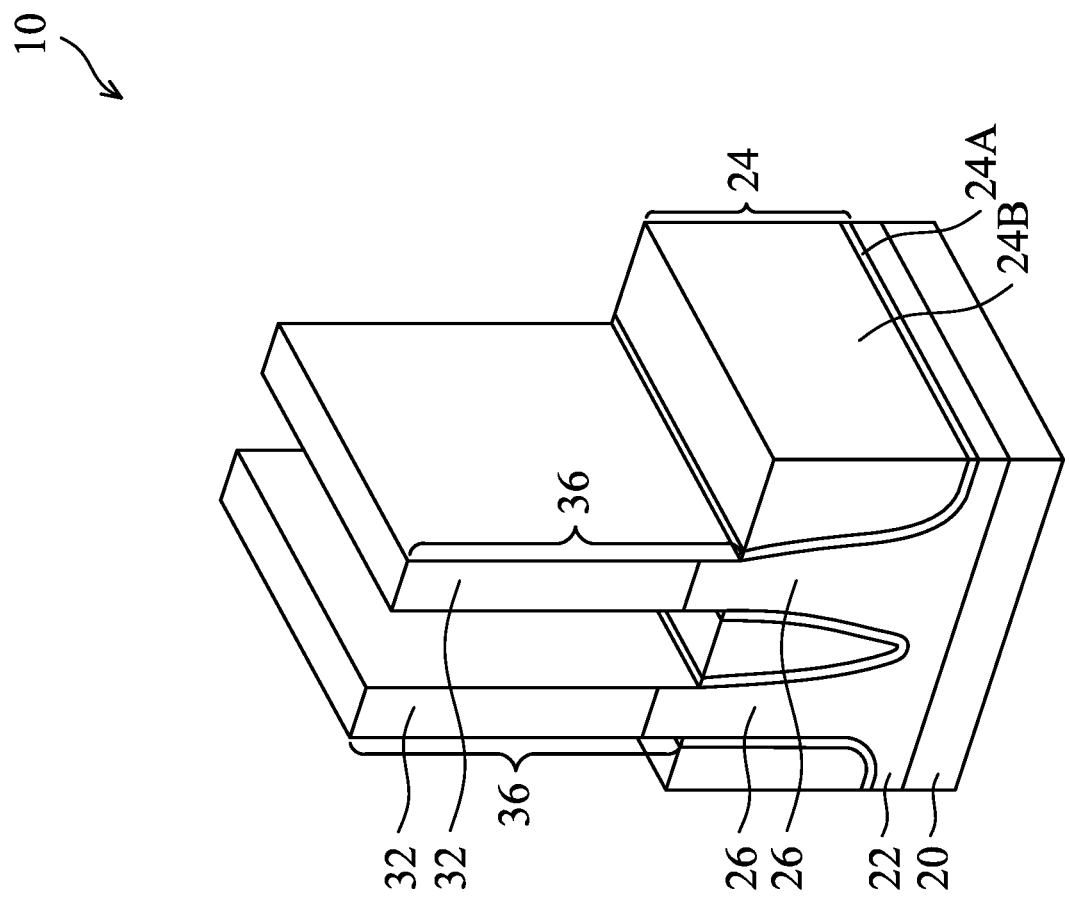

Referring to FIG. 5, STI regions 24 are recessed, so that the top portions of semiconductor strips 32 protrude higher than the top surfaces of the remaining portions of STI regions 24 to form protruding fins 36. The respective process is illustrated as process 208 in the process flow 200 as shown in FIG. 14. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etching process. The etching chemical may include diluted HF, for example.

In accordance with some embodiments of the present disclosure, the top surfaces of the recessed STI regions 24 are lower than the interfaces between semiconductor strips 32 and the corresponding underlying semiconductor strips 26. In accordance with alternative embodiments of the present disclosure, the top surfaces of the recessed STI regions 24 are level with or higher than the interfaces between semiconductor strips 32 and the corresponding underlying semiconductor strips 26.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 6:
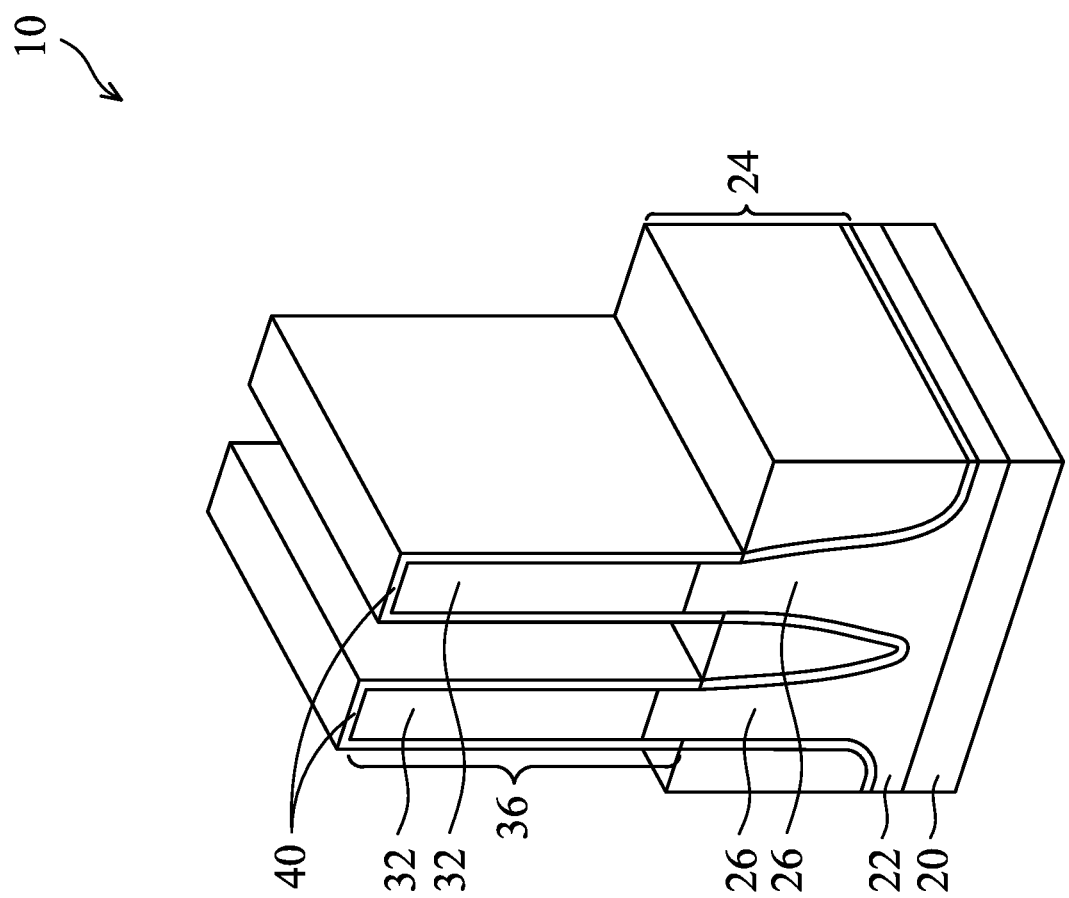

FIG. 6 illustrates the deposition of semiconductor cap layers 40. The respective process is illustrated as process 210 in the process flow 200 as shown in FIG. 14. Semiconductor cap layers 40 are formed as conformal layers, with the thicknesses of the horizontal portions being equal to or substantially equal to (for example, with the difference being smaller than about 10 percent) the thicknesses of the vertical portions. The formation of semiconductor cap layers 40 is selective, so that they are grown on semiconductor materials such as semiconductor strips 32, and not on STI regions 24. This may be achieved, for example, by adding an etching gas into the deposition gas such as silane (SiH4) and/or dichlorosilane (DCS). The deposition may be performed using a conformal deposition method such as CVD or ALD. In accordance with some embodiments of the present disclosure, semiconductor cap layers 40 are formed of silicon, which may be free or substantially free from other elements such as germanium, carbon, or the like. For example, the atomic percentage of silicon in semiconductor cap layers 40 may be higher than about 95 percent or 99 percent. In accordance with other embodiments, semiconductor cap layers 40 are formed of other semiconductor materials different from the materials of semiconductor strips 32. For example, semiconductor cap layers 40 may be formed of silicon germanium with a lower germanium concentration than that of semiconductor strips 32. Semiconductor cap layers 40 may be epitaxially grown as crystalline semiconductor layers or may be formed as polycrystalline semiconductor layers, which may be achieved, for example, by adjusting the temperature and the growth rate in the deposition process. Semiconductor cap layers 40 may have a thickness greater than about 3 Å, and the thickness may be in the range between about 3 Å and about 20 Å.

In accordance with some embodiments, semiconductor cap layers 40 are intrinsic layers, which are neither in-situ doped with a p-type impurity nor in-situ doped with an n-type impurity in the deposition. In accordance with alternatively embodiments, semiconductor cap layers 40 are in-situ doped with a p-type impurity or an n-type impurity, and the doping concentration is lower than that in the well region 22. For example, the doping concentration may be lower than about $10^{17}$ cm$^{-3}$, or lower than about $10^{15}$ cm$^{-3}$. The conductivity type of semiconductor cap layers 40, if in-situ doped during the deposition process, is the same as the conductivity type of well region 22.

Figure 7:
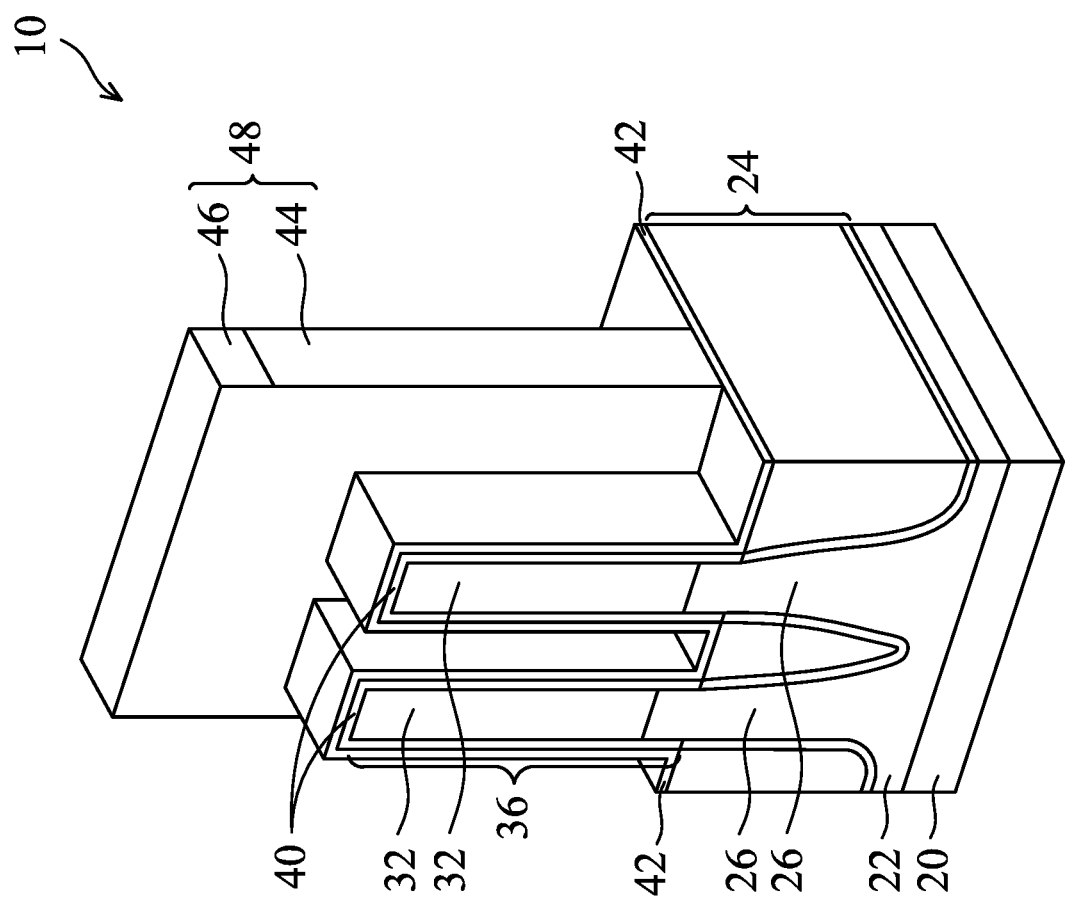

Referring to FIG. 7, dummy gate dielectric layer 42, dummy gate electrode 44, and hard mask 46 are formed. The respective process is illustrated as process 212 in the process flow 200 as shown in FIG. 14. Dummy gate dielectric layer 42 may be formed of silicon oxide or other dielectric materials, and may be formed through deposition, so that it contacts the sidewalls and the top surfaces of protruding fins 36. Dummy gate electrode 44 may be formed, for example, using polysilicon, and other materials may also be used. One (or a plurality of) hard mask layer(s) 46 are formed over dummy gate electrode 44. Hard mask layers 46 may be formed of silicon nitride, silicon oxide, silicon carbo-nitride, or multi-layers thereof. Throughout the description, hard mask layers 46 and dummy gate electrode 44 are collectively referred to as dummy gate stack 48. Dummy gate stack 48 may cross over a single one or a plurality of protruding fins 36 and/or STI regions 24. Dummy gate stack 48 also has a lengthwise direction perpendicular to the lengthwise directions of protruding fins 36. Dummy gate stack 48 may be formed by depositing a blanket dummy gate electrode layer over the dummy gate dielectric layer 42, a blanket hard mask layer over the blanket dummy gate electrode layer, and then performing an anisotropic etching process(es) on the blanket hard mask layer and the blanket dummy gate electrode layer. In accordance with some embodiments of the present disclosure, the etching stops on dummy gate dielectric layer 42, which is used as an etch stop layer. In accordance with some embodiments of the present disclosure, dummy gate dielectric layer 42 is also etched, and the dummy gate stack 48 also includes a remaining portion of dummy gate dielectric layer 42. As a result, the top surfaces of STI regions 24 are exposed.

Next, gate spacers 50 and fin spacers 52 are formed on the sidewalls of dummy gate stack 48 and the sidewalls of protruding fins 36, respectively. The respective process is illustrated as process 214 in the process flow 200 as shown in FIG. 14. In accordance with some embodiments of the present disclosure, gate spacers 50 and fin spacers 52 are formed of a dielectric material(s) such as silicon nitride, silicon carbo-nitride, or the like, and may have a single-layer structure or a multi-layer structure including a plurality of dielectric layers. The formation process may include depositing a dielectric spacer layer(s), and performing an anisotropic etching process to remove horizontal portions of the dielectric spacer layer over the top surfaces of dummy gate stack 48 and protruding fins 36. The etching may also be performed using dummy gate dielectric layer 42 as an etch stop layer.

FIGS. 9A, 9B, 9C, 10A, 10B, and 10C illustrate perspective views and cross-sectional views of intermediate stages in the etching of dummy gate dielectric layer 42, the recessing of semiconductor cap layer 40 and protruding fins 36, and the further lateral recessing of semiconductor cap layer 40. In FIGS. 9A, 9B, 9C, 10A, 10B, and 10C, the figure numbers include letter "A," "B," or letter "C." The letter "A" indicates that the respective figures illustrate perspective views. The letter "B" indicates that the respective figure shows the reference cross-section "B-B" in the respective perspective view. The letter "C" indicates that the respective figure shows the top view of the structure, and the top view shows the cross-section at the horizontal plane containing line C-C.

Figure 8:
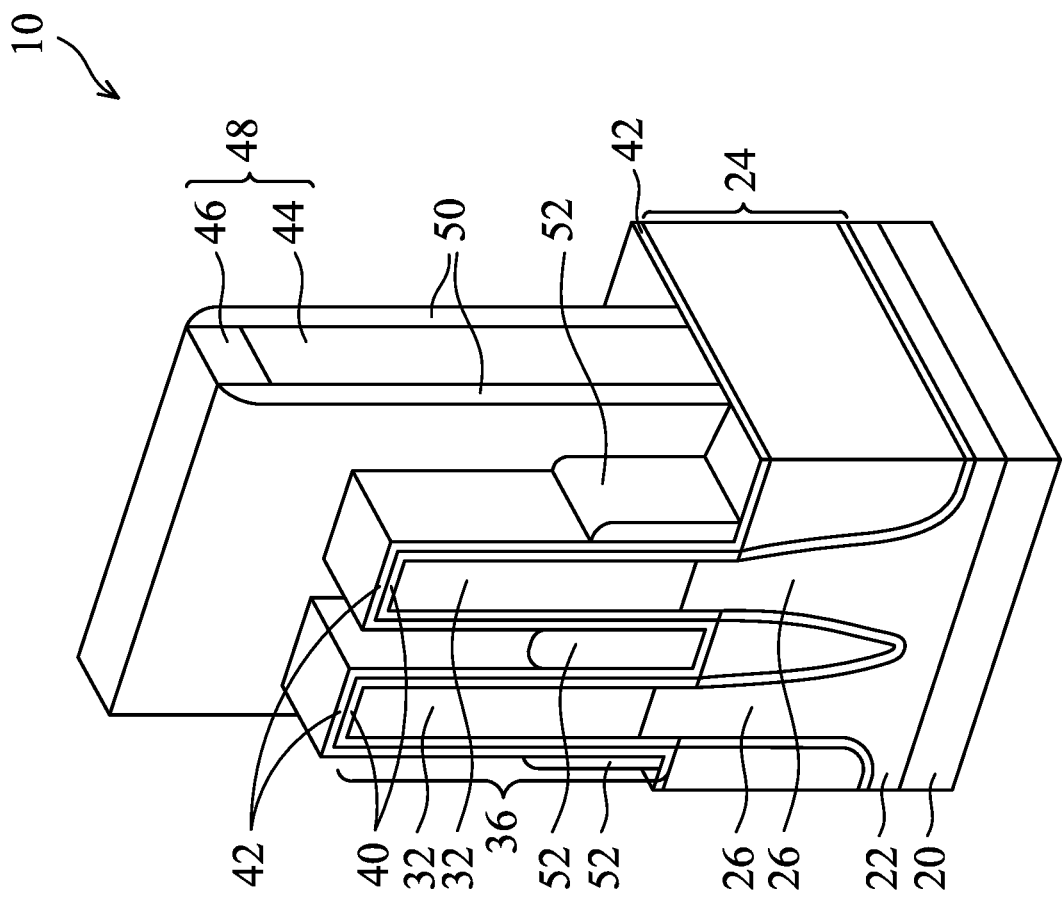
Figure 9A:
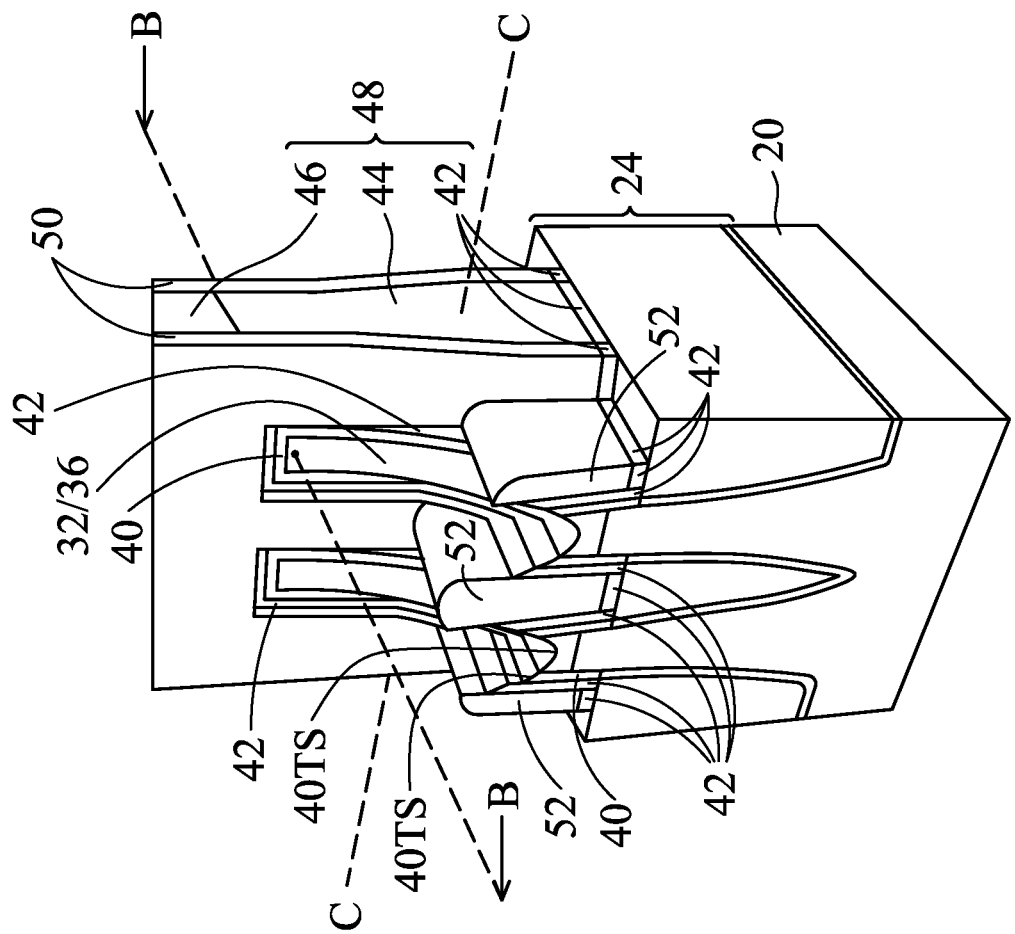
Figure 9B:
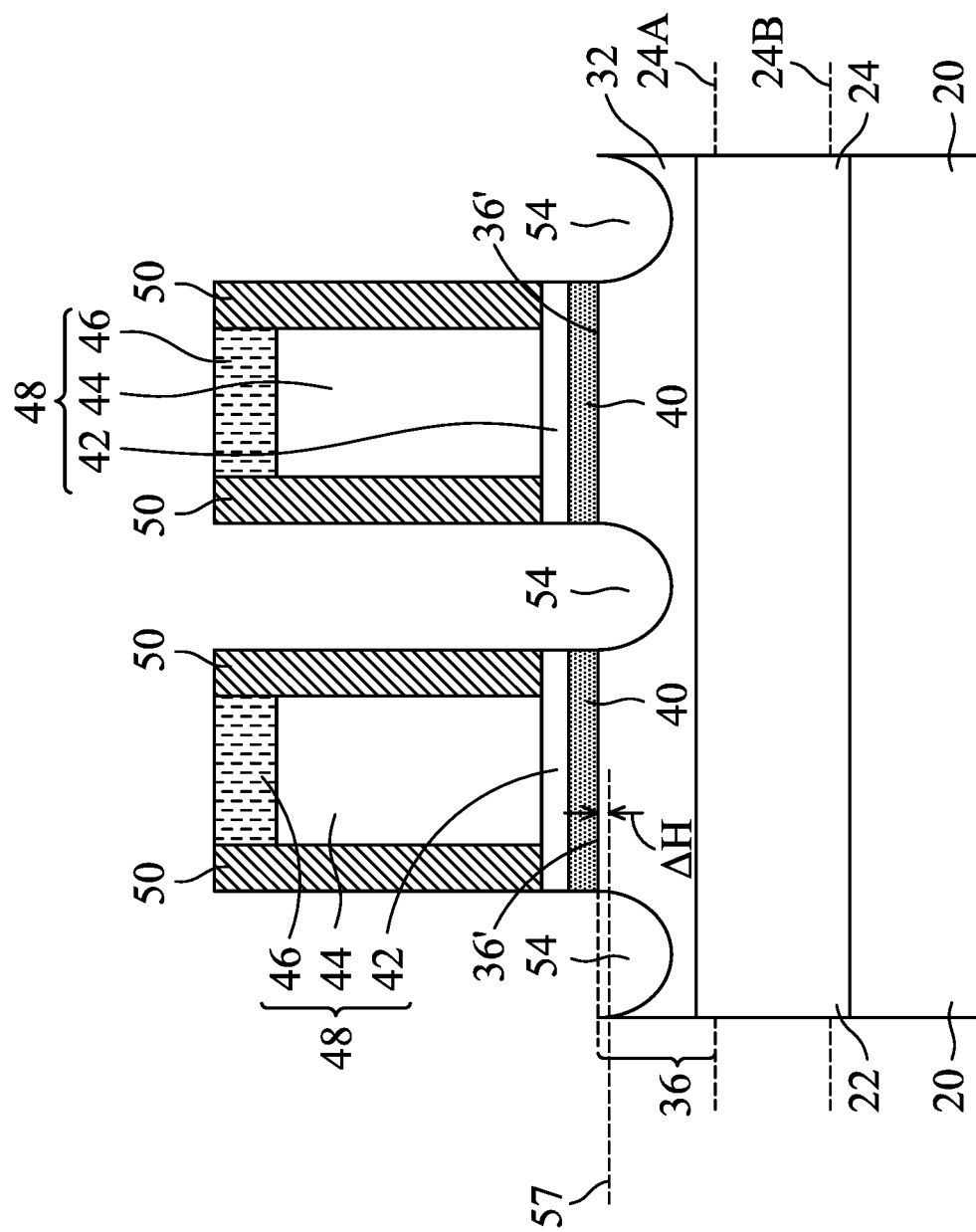
Figure 9C:
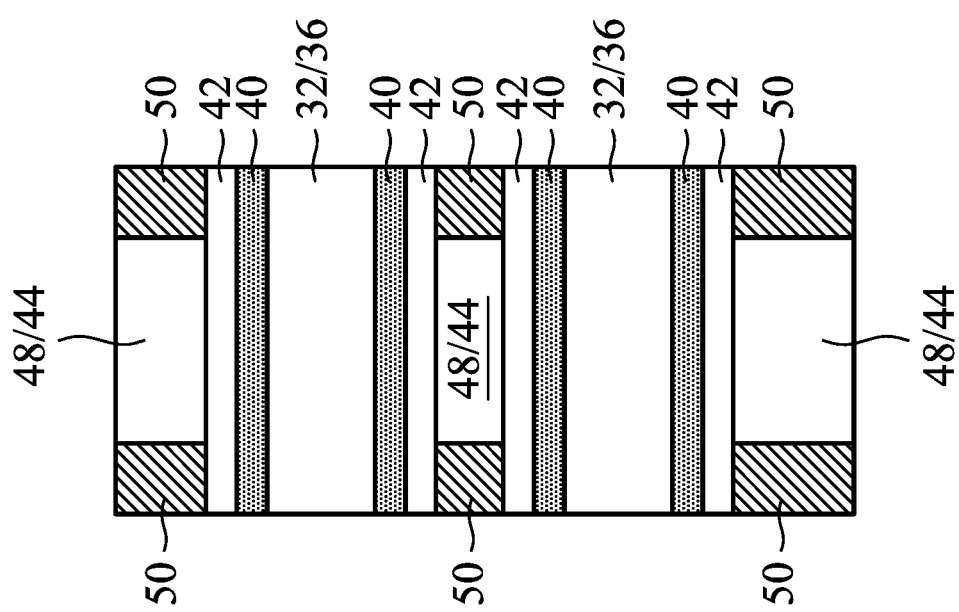

Anisotropic etching processes are first performed to etch the horizontal portions of dummy gate dielectric layer 42 as shown in FIG. 8. Semiconductor cap layers 40 are thus exposed. Next, semiconductor cap layers 40 and protruding fins 36 are etched. The resulting structure is shown in FIGS. 9A, 9B, and 9C. In accordance with some embodiments of the present disclosure, dummy gate dielectric layer 42 is etched using the mixed gases of NF$_3$ and NH$_3$, or the mixed gases of HF and NH$_3$. Semiconductor cap layer 40 (which may be a silicon cap or a semiconductor cap formed of other materials) may be etched using fluorine-based and/or chlorine-based gases such as C$_2$F$_6$, CF$_4$, the mixture of HBr, Cl$_2$, and O$_2$, or the mixture of HBr, Cl$_2$, O$_2$, and CF$_2$ etc. Protruding fins 36 may be etched using HBr and/or a fluorine-containing etching gas such as C$_2$F$_6$, CF$_4$, CF$_2$Cl$_2$, or the like. The respective process is illustrated as process 216 in the process flow 200 as shown in FIG. 14. The spaces left by the removed portions of protruding fins 36 are referred to as recesses 54 (marked in FIG. 9B) hereinafter. In accordance with some embodiments, the bottom surfaces of recesses 54 are higher than the top surfaces of STI regions 24. Furthermore, the bottom surfaces of recesses 54 may be higher than the interfaces between semiconductor strips 26 and semiconductor strips 32. As a result, there may be some bottom portions of semiconductor strips 32 left to be directly underlying recesses 54. In accordance with some embodiments of the present disclosure, the bottom surfaces of recesses 54 are lower than fin spacers 52.

As shown in FIG. 9A, at the bottom of recess 54, the top surface 40TS of semiconductor cap layer 40 may be level with or higher than the top surface 32TS of semiconductor strip 32. In accordance with some embodiments of the present disclosure, the top surfaces 40TS and 32TS may be slanted. For example, at the bottom of recess 54, an entirety of the slanted top surface 40TS may be higher than an entirety of top surface 32TS. In accordance with alternative embodiments, top surface 40TS may include a first portion higher than an entirety of top surface 32TS, and a second portion at a same level as a portion of the slanted top surface 32TS.

FIG. 9B illustrates the reference cross-section B-B in FIG. 9A. FIG. 9B illustrates two neighboring dummy gate stacks 48, while there may be more dummy gate stacks 48 allocated in parallel. The portions of semiconductor cap layer 40 and semiconductor strip 32 between neighboring dummy gate stacks 48 are etched, and the portions of semiconductor cap layer 40 and semiconductor strip 32 directly underlying dummy gate stacks 48 remain as the channel regions of the respective FinFETs. Due to the anisotropic etching, the edges of semiconductor cap layer 40 are flush with the corresponding edges of gate spacers 50. In accordance with some embodiments of the present disclosure, the top portions of semiconductor strip 32 have edges flush with the corresponding edges of gate spacers 50, while the bottom portions of semiconductor strip 32 may have curved top surfaces, which converge to the center line between neighboring gate spacers 50.

FIG. 9C illustrates a top view of a portion of the structure in FIG. 9A, with the top view being obtained at a level close to, and slightly below, the top surface level of semiconductor strip 32. For example, the top view may be obtained from level 57 as shown in FIG. 9B, wherein level 57 is close to, and is slightly lower than top surface 36' of protruding fin 36 by height difference ΔH, with height difference λH being in the range between about 5 nm and about 10 nm, for example. The level 57 is the same as the level of line C-C in FIG. 9A. At this level, as shown in FIG. 9C, the left edge of semiconductor strip 32 (which is a part of protruding fin 36) is flush with (aligned to) the left edges of semiconductor cap layer 40 and the left edges of gate spacers 50, and the right edge of semiconductor strip 32 and protruding fin 36 are flush with (aligned to) the right edges of semiconductor cap layer 40 and the right edges of gate spacers 50.

Figure 9D:
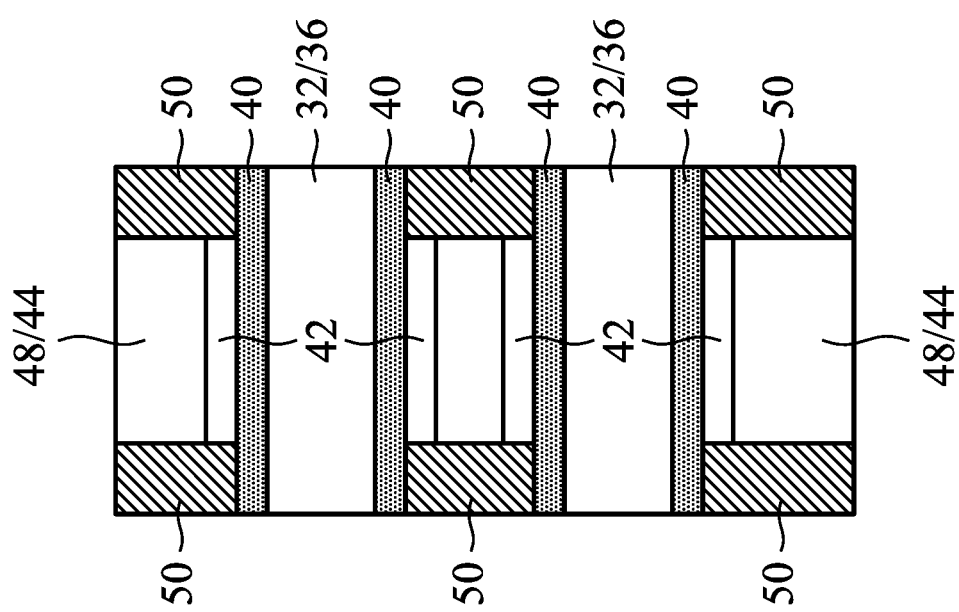

FIG. 9C illustrates the structure in accordance with some embodiments, in which, as shown in FIG. 8, gate spacers 50 are formed when gate dielectric layer 42 is not patterned, and hence as shown in FIG. 9C, the left edges and the right edges of gate dielectric 42 are also flush with the left edges and right edges, respectively, of semiconductor cap layer 40. FIG. 9D illustrates the structure in accordance with alternative embodiments, in which gate dielectric layer 42 is also patterned when gate spacers 50 are formed. According, the left edges of gate dielectric 42 are flush with the left edges of the left gate spacers 50, and the right edges of gate dielectric 42 are flush with the right edges of right spacers 50.

After the etching process, a photo resist removal process is performed, which photo resist is used to cover some regions of the respective wafer, while leaving some other regions (such as the illustrated FinFET regions) exposed. Next, a post-etch cleaning process is performed to remove the by-products generated in preceding processes. In accordance with some embodiments of the present disclosure, the post-etch cleaning may include a wet etch process, which may be performed using diluted hydrogen fluoride (DHF), a chemical solution comprising $NH_4OH$, $H_2O_2$, and $H_2O$ (sometimes referred to as Standard Clean 1 (SC1) solution), and/or a chemical solution comprising HCl, $H_2O_2$, and $H_2O$ (sometimes referred to as Standard Clean 2 (SC2) solution), and hence the residues and particles on the surfaces of the exposed semiconductor regions are removed. In the post-etch cleaning process, semiconductor cap layer 40, gate spacers 50, and semiconductor strip 32 are substantially not etched and not damaged. According, the resulting structure after the post-etch cleaning process are the same as shown in FIGS. 9A, 9B, and 9C.

Figure 10A:
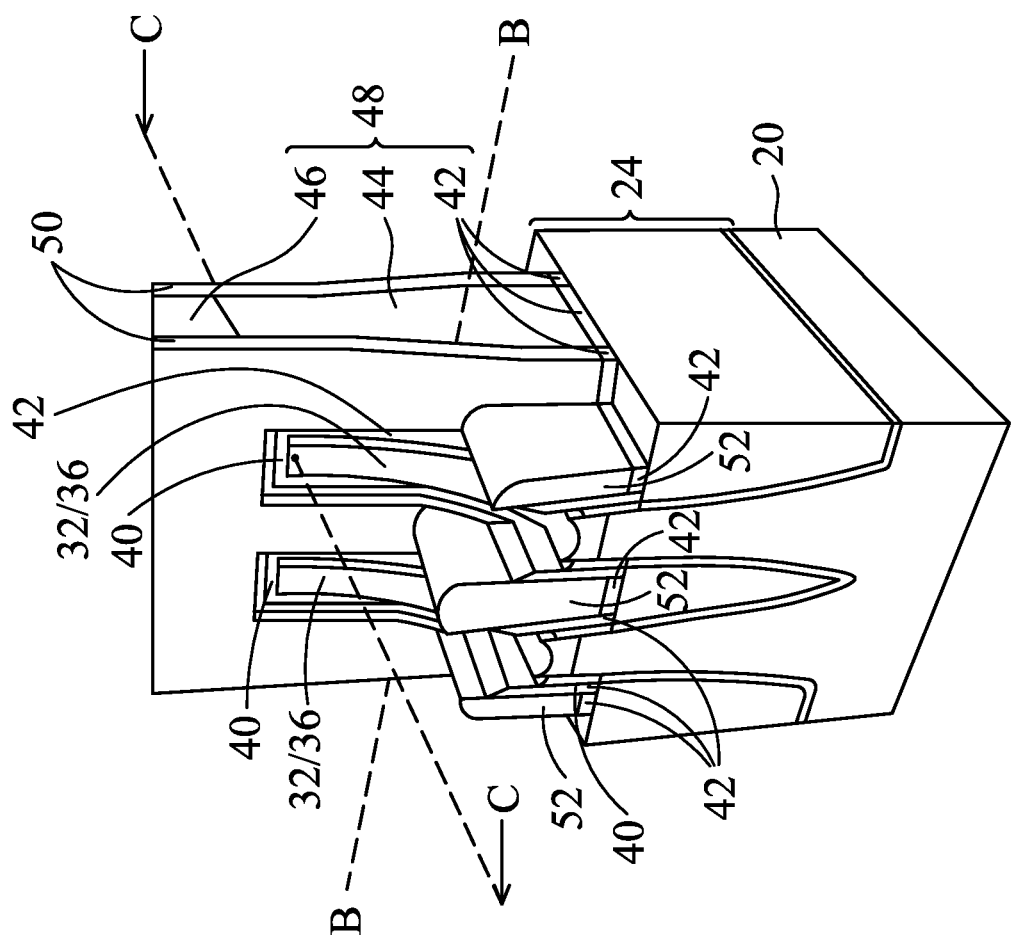
Figure 10B:
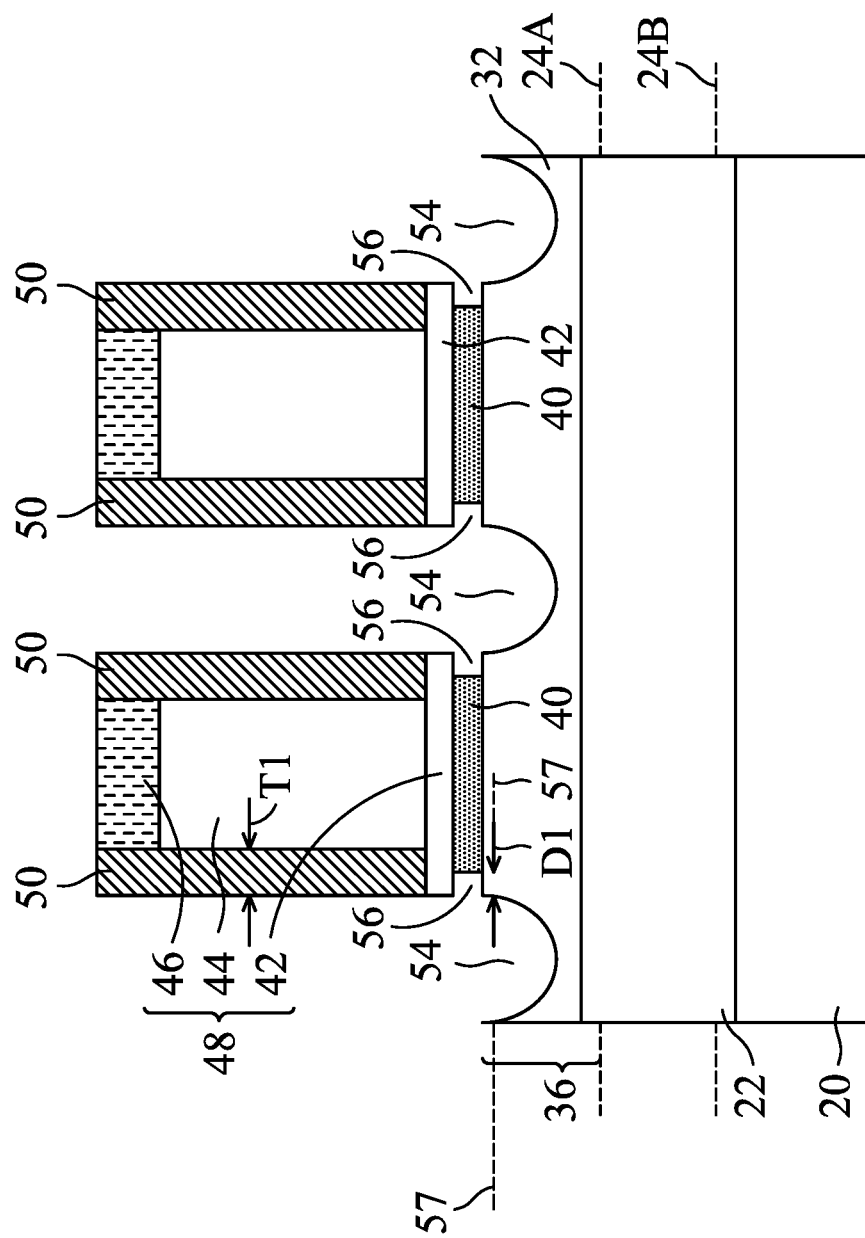
Figure 10C:
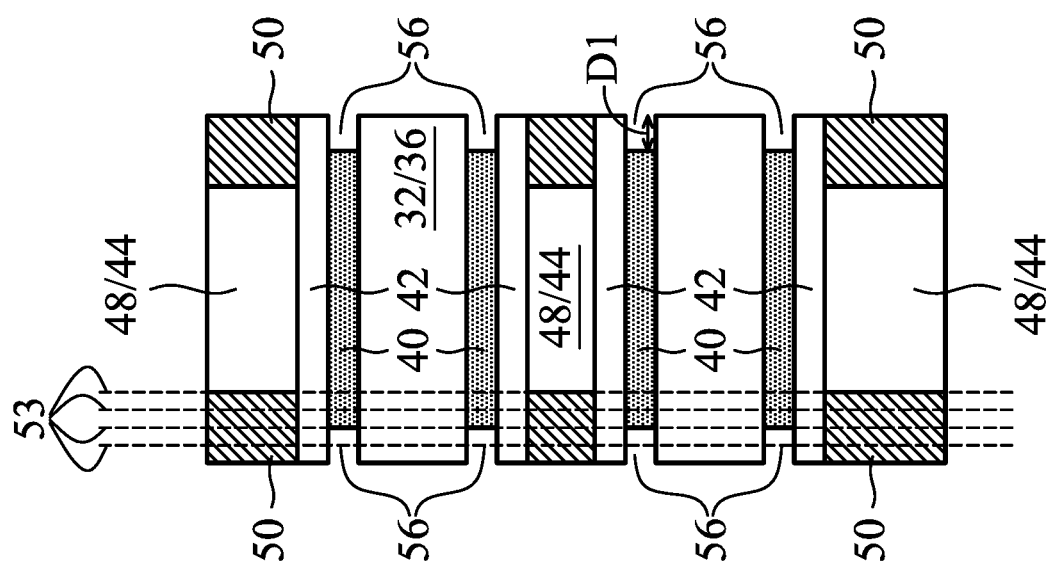

Next, semiconductor cap layer 40 is recessed laterally to form recesses 56, and FIGS. 10A, 10B, and 10C illustrate the resulting structure. The respective process is illustrated as process 218 in the process flow 200 as shown in FIG. 14. In accordance with some embodiments of the present disclosure, the lateral-recessing is performed through an isotropic etching process, which may be or include a dry etching process or a wet etching process. The etching chemical (the etching gas or the etching solution) is selected, so that it etches semiconductor cap layer 40, and does not etch semiconductor strip 32, gate dielectric layer 42, gate spacers 50, and hard mask 46. In accordance with some embodiments, the etching selectivity, which is the ratio of the etching rate of semiconductor cap layer 40 to the etching rate of semiconductor strip 32 (a part of protruding fin 36) is higher than about 10, and may be higher than about 20, 50, or higher. In accordance with some embodiments of the present disclosure, a dry etching process is adopted, and the etching gas comprises with hydrogen ($H_2$) and He gases. For example, the temperature of wafer (and the temperature of silicon cap layer 40) may be higher than about 200 degrees, and may be in the range between about 200 degrees and about 400 degrees. At the high temperatures, the $H_2$ gas reacts with silicon. Since the bonding energy of GeH is higher than that of SiH, germanium has a smaller loss ratio than silicon, which causes the etching rate of SiGe to be higher than that of silicon.

FIG. 10B illustrates the vertical reference cross-section B-B in FIG. 10A. FIG. 10B illustrates that semiconductor cap layer 40 is laterally recessed from the respective outer edges of gate spacers 50 and the respective edges of underlying portions of semiconductor strips 32/fins 36. The recessing process may be controlled so that the recessing distance D1 is not greater than the thickness T1 of gate spacers 50. The recessing distance D1 may be greater than about 1 nm and smaller than about 2 nm. Furthermore, the ratio D1/T1 is greater than 0, and may be equal to or smaller than 1.0. Ratio D1/T1 may be in the range between about 0.2 and about 1.0, for example.

FIG. 10C illustrates a top view of a portion of the structure in FIG. 10A, with the top view being obtained at a level close to, and slightly below, the top surface level of semiconductor strip. The level is also marked as level 57 in FIG. 10B. The possible positions of the edges of the recessed semiconductor cap layer 40 are marked by dashed lines 53 as shown in FIG. 10C. Recesses 56 are formed between gate spacers 50 and semiconductor strips 32/protruding fins 36, which form the channel region of the respective FinFET.

Figure 10D:
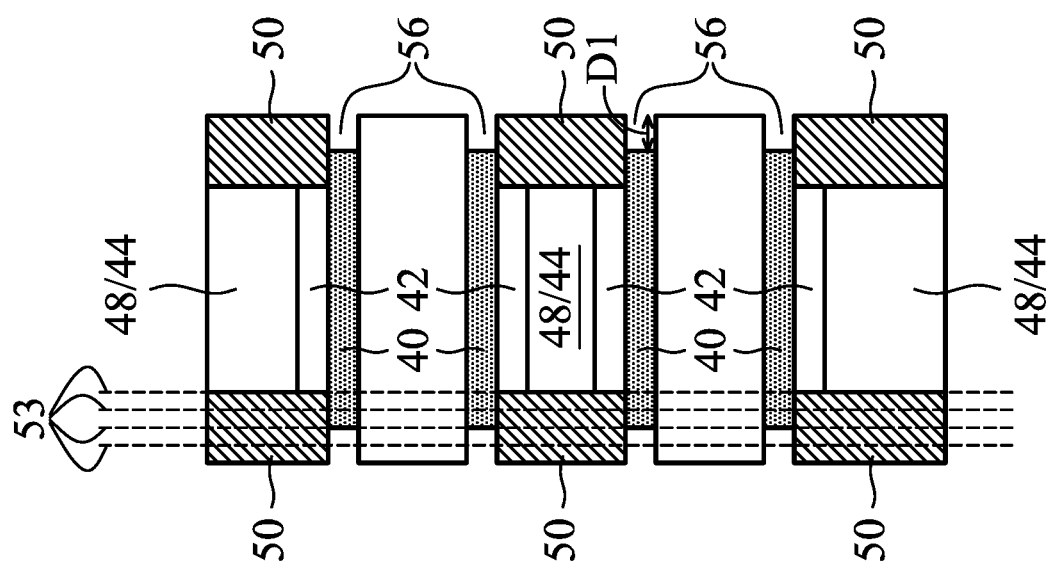

FIG. 10D illustrates the top view of a portion of the structure in FIG. 10A in accordance with alternative embodiments, This structure is similar to the structure shown in FIG. 10C, except that that the left edges and the right edges of gate dielectrics 42 do not extend to the outer edges of dummy gate electrode 44. Rather, the left edges of gate dielectric 42 are flush with the left edges of the left gate spacers 50, and the right edges of gate dielectric 42 are flush with the right edges of right spacers 50. The left edges of the left gate spacers 50 and the right edges of the right gate spacers are also referred to as outer edges of gate spacers 50.

Figure 11:
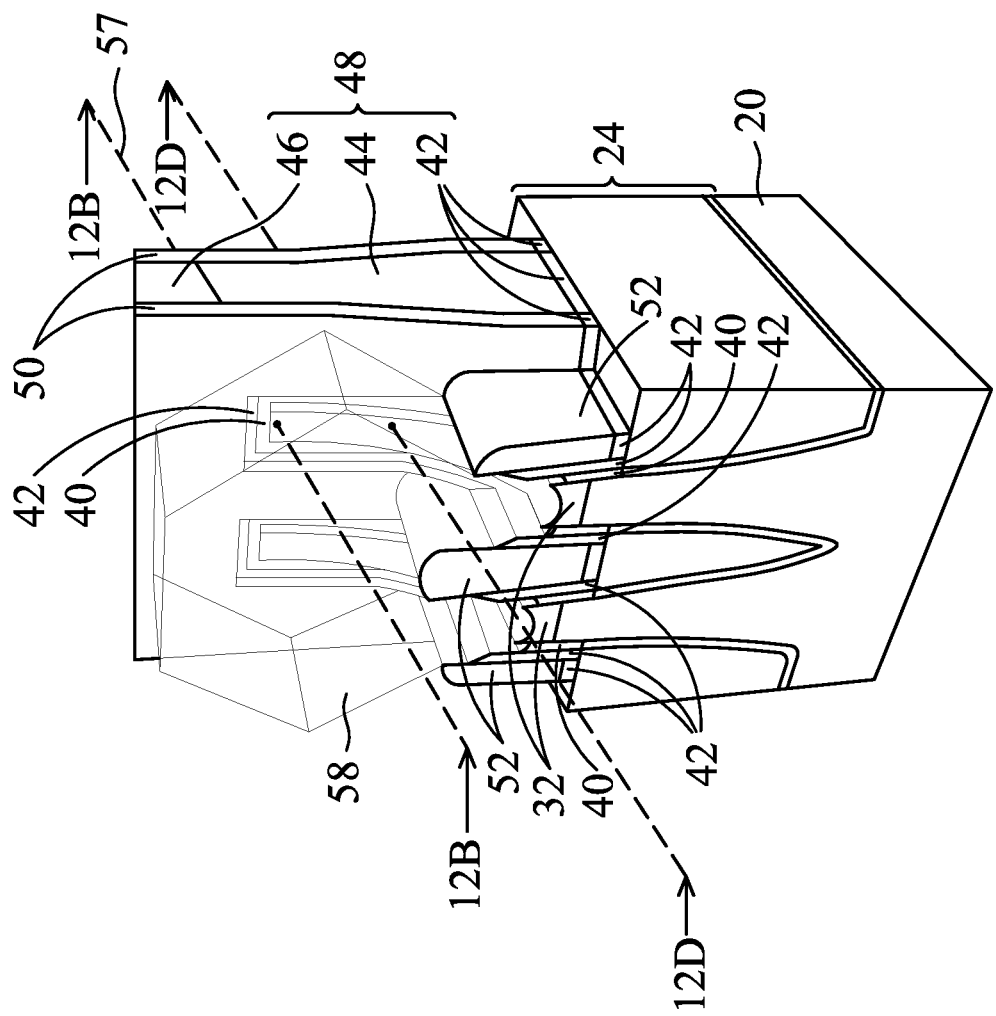

Next, epitaxy regions (source/drain regions) 58 are formed by selectively growing (through epitaxy) a semiconductor material in recesses 56 (FIGS. 10B and 10C) and recesses 54 (FIG. 10B), resulting in the structure in FIG. 11. The respective process is illustrated as process 220 in the process flow 200 as shown in FIG. 14. Depending on whether the resulting FinFET is a p-type FinFET or an n-type FinFET, a p-type impurity or an n-type impurity may be in-situ doped with the proceeding of the epitaxy. For example, when the resulting FinFET is a p-type FinFET, silicon germanium boron (SiGeB) or silicon boron (SiB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 58 comprise III-V compound semiconductors such as GaAs, InP, GaN, InGaAs, InAlAs, GaSb, AlSb, AlAs, AlP, GaP, combinations thereof, or multi-layers thereof. After recesses 54 and 56 are filled, the further epitaxial growth of epitaxy regions 58 causes epitaxy regions 58 to expand horizontally, and facets may be formed. The further growth of epitaxy regions 58 may also cause neighboring epitaxy regions 58 to merge with each other. In accordance with some embodiments of the present disclosure, the formation of epitaxy regions 58 may be finished when the top surface of epitaxy regions 58 is still wavy, or when the top surface of the merged epitaxy regions 58 has become planar, which is achieved by further growing on the epitaxy regions 58 as shown in FIG. 11.

After the epitaxy process, epitaxy regions 58 may be further implanted with a p-type or an n-type impurity to form source and drain regions, which are also denoted using reference numeral 58. In accordance with alternative embodiments of the present disclosure, the implantation process is skipped when epitaxy regions 58 are in-situ doped with the p-type or n-type impurity during the epitaxy.

Figure 12A:
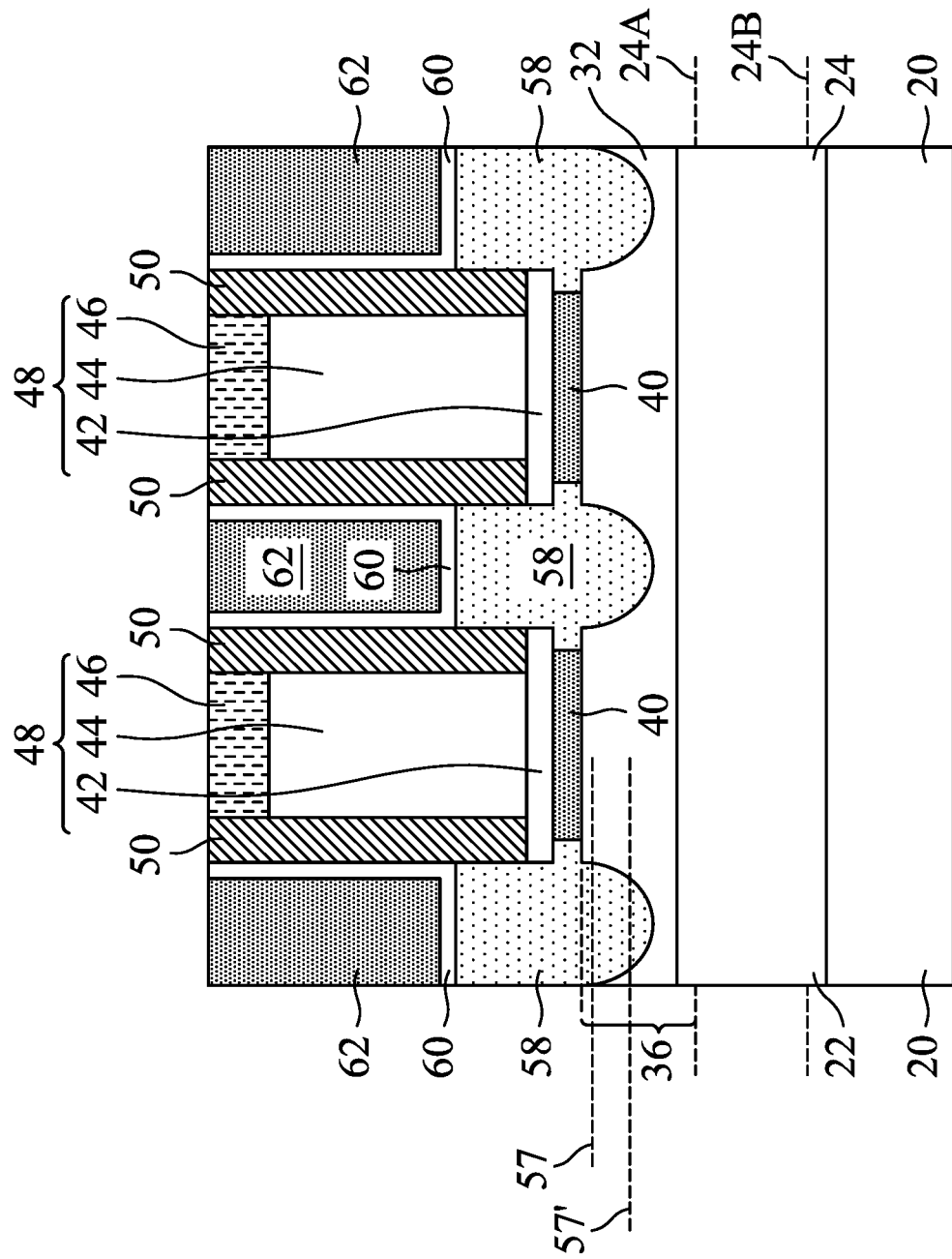

FIG. 12A illustrates a cross-sectional view of the structure after the formation of Contact Etch Stop Layer (CESL) 60 and Inter-Layer Dielectric (ILD) 62. CESL 60 may be formed of silicon oxide, silicon nitride, silicon carbo-nitride, or the like, and may be formed using CVD, ALD, or the like. ILD 62 may include a dielectric material formed using, for example, FCVD, spin-on coating, CVD, or another deposition method. ILD 62 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 62, dummy gate stack 48, and gate spacers 50 with each other. As shown in FIG. 12A, epitaxy regions 58 extend directly underlying gate spacers 50 to contact semiconductor cap layer 40.

Figure 12B:
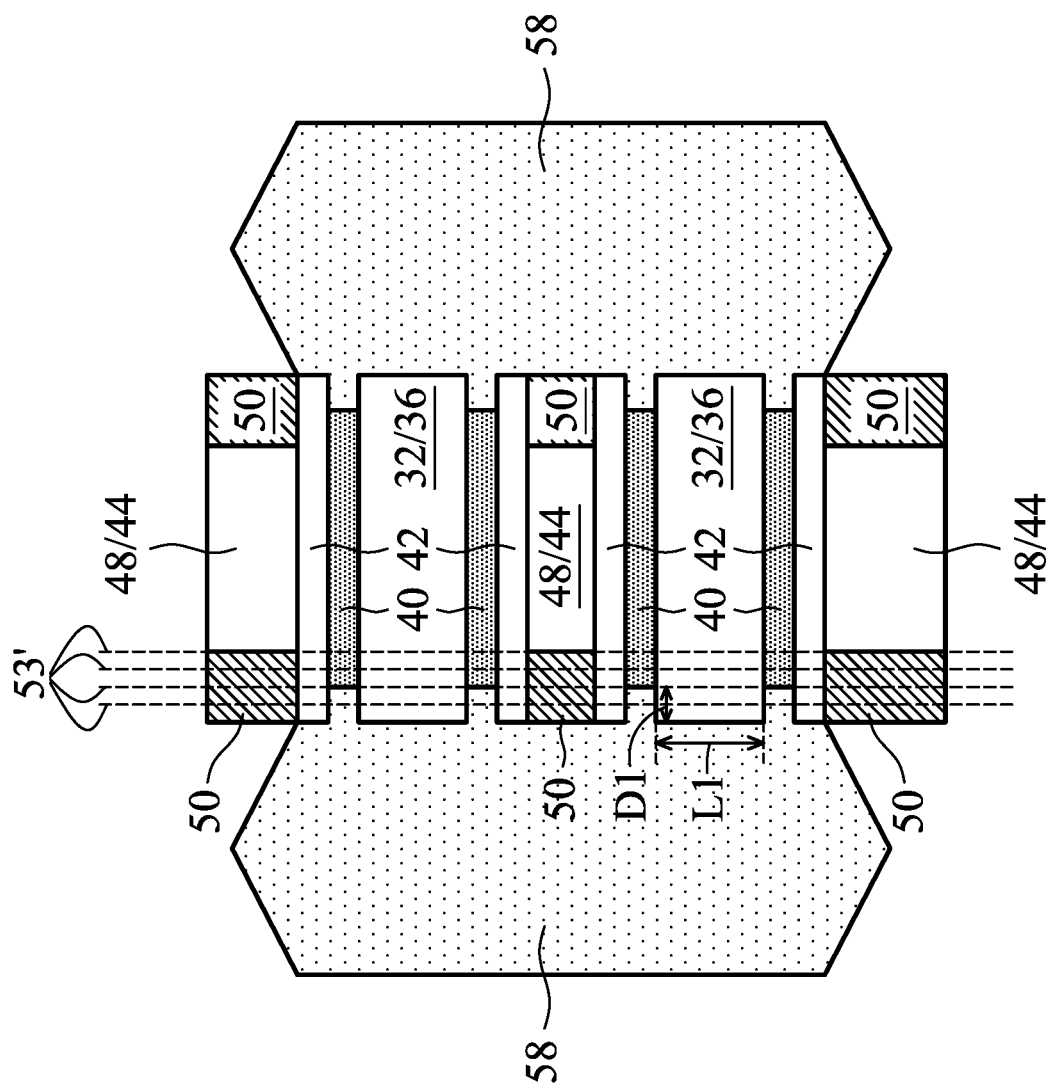
Figure 12C:
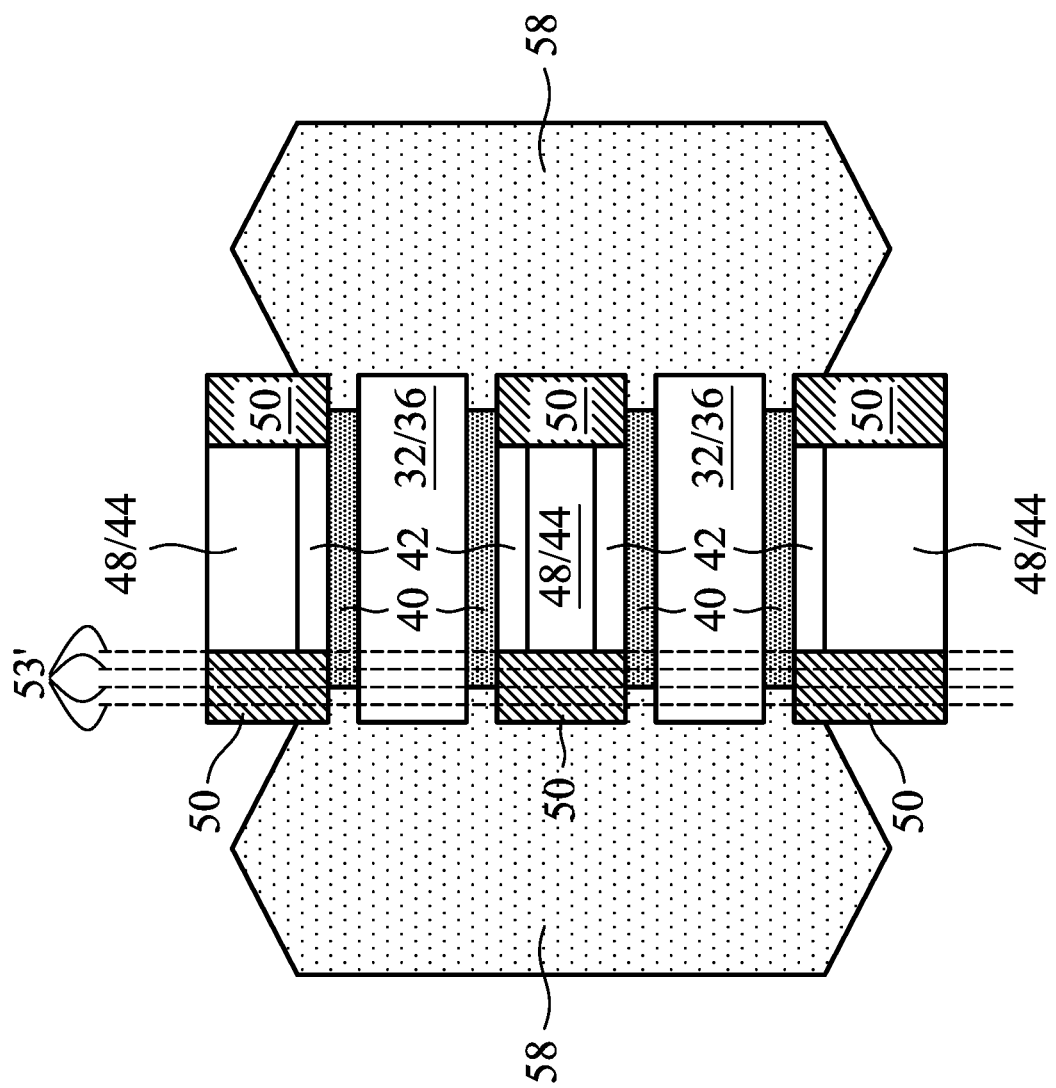

FIG. 12B illustrates a top view of the structure in FIG. 12A, with the top view being obtained at a level close to, and slightly below, the top surface level of protruding fin 36. The level is also marked as level 57 in FIG. 12A. Also, FIG. 12B illustrates the reference cross-section 12B-12B in FIG. 11. The length of the interface between epitaxy source/drain region 58 and its contacting protruding fin 36 is equal to L1+2D1. As a comparison, if semiconductor cap layer 40 is not recessed, the length of the interface between epitaxy region 58 and its contacting protruding fin 36 would have been equal to L1. Accordingly, recessing semiconductor cap layer 40 results in an increase in the contact area between epitaxy source/drain region 58 and its contacting protruding fin 36. Since semiconductor cap layer 40 is undoped or lightly doped, its sheet resistance is high, and its ability for conducting channel current is limited. Increasing the contact area thus results in the reduction in the current crowding. FIG. 12C illustrates the top view of a portion of the structure similar to the structure shown FIG. 12B, except that the right edges of gate dielectrics 42 do not extend to the outer edges of dummy gate electrode 44. Rather, the left edges of gate dielectric 42 are flush with the left edges of the left gate spacers 50, and the right edges of gate dielectric 42 are flush with the right edges of right spacers 50.

Figure 12D:
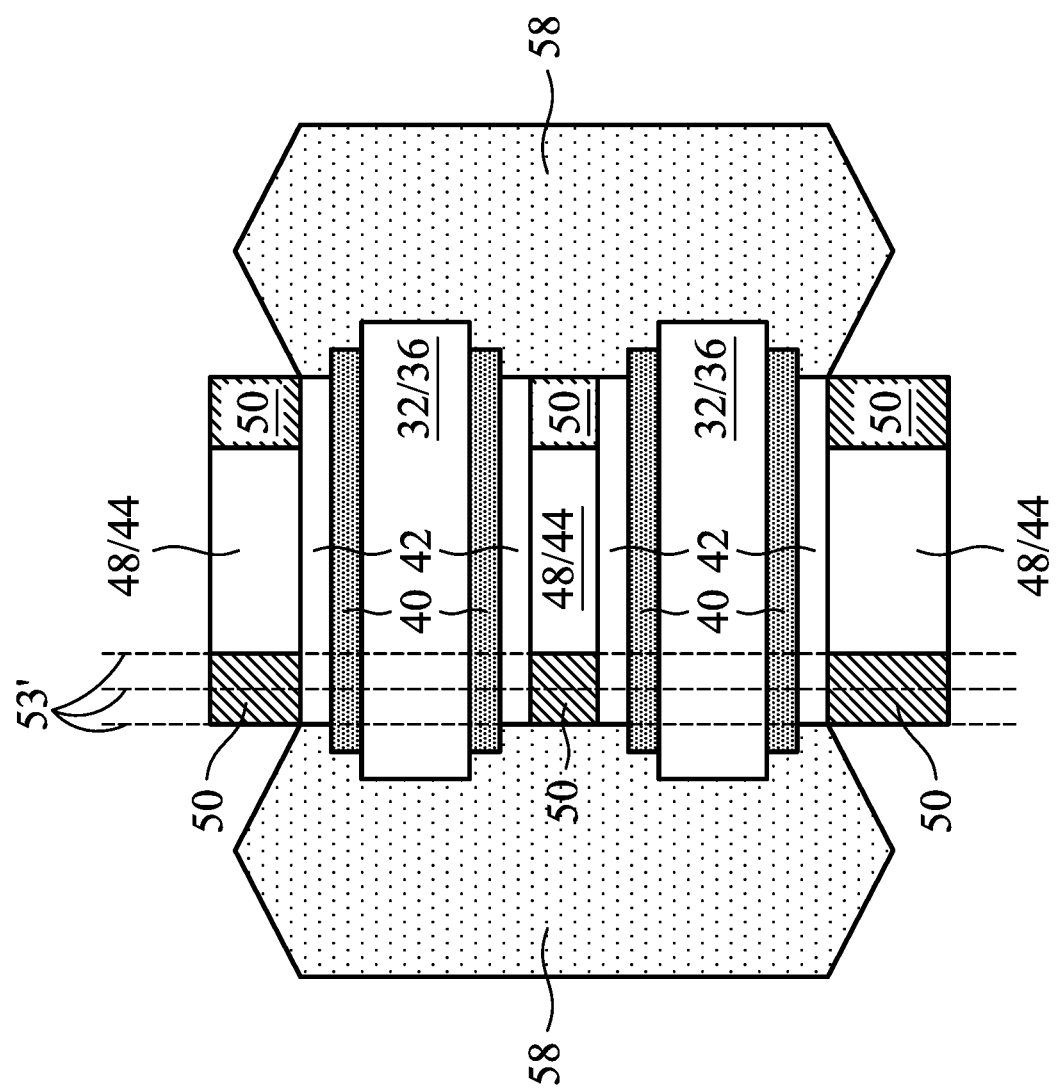

FIG. 12D illustrates the top view of a portion of the structure similar to the structure shown FIG. 12B, except that the top view in FIGS. 12B and 12D are obtained at different levels. For example, the top view shown in FIG. 12D is obtained from the level 57' as shown in FIGS. 11 and 12A, which level 57' is lower than level 57. Also, FIG. 12D illustrates the reference cross-section 12D-12D in FIG. 11. As shown in FIGS. 12B and 12D, when the levels are lower, the un-etched portions of semiconductor strips 32 may protrude more beyond the outer edges of gate spacers 50. Furthermore, with the edges of the corresponding semiconductor caps 40 may also protrude beyond the outer edges of gate spacers 50. At different levels, the edges of the corresponding semiconductor caps 40 are still recessed relative to the semiconductor strips 32. The possible positions of the edges of the recessed semiconductor cap layers 40 are marked by dashed lines 53'.

Figure 13:
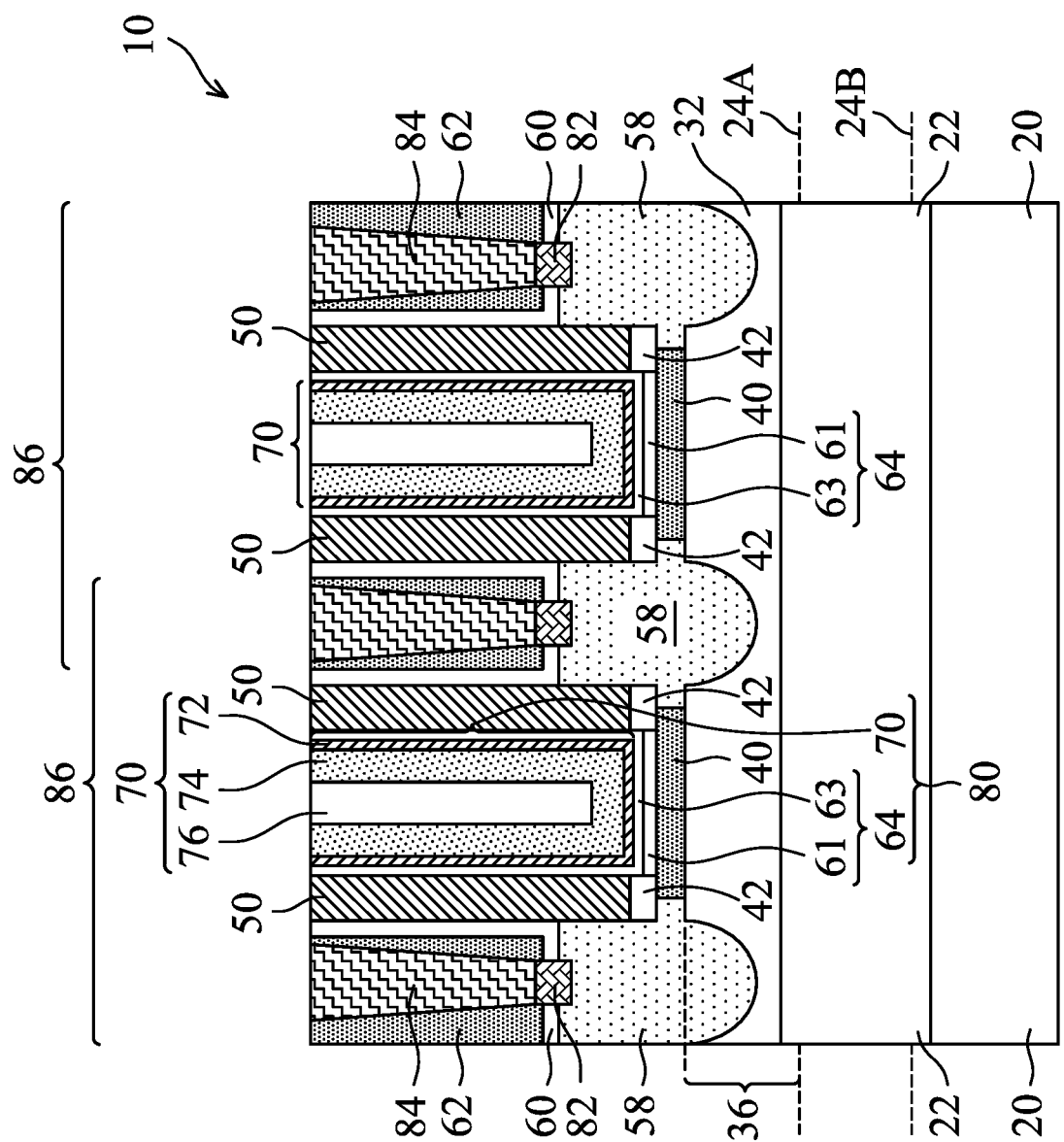
Figure 14:
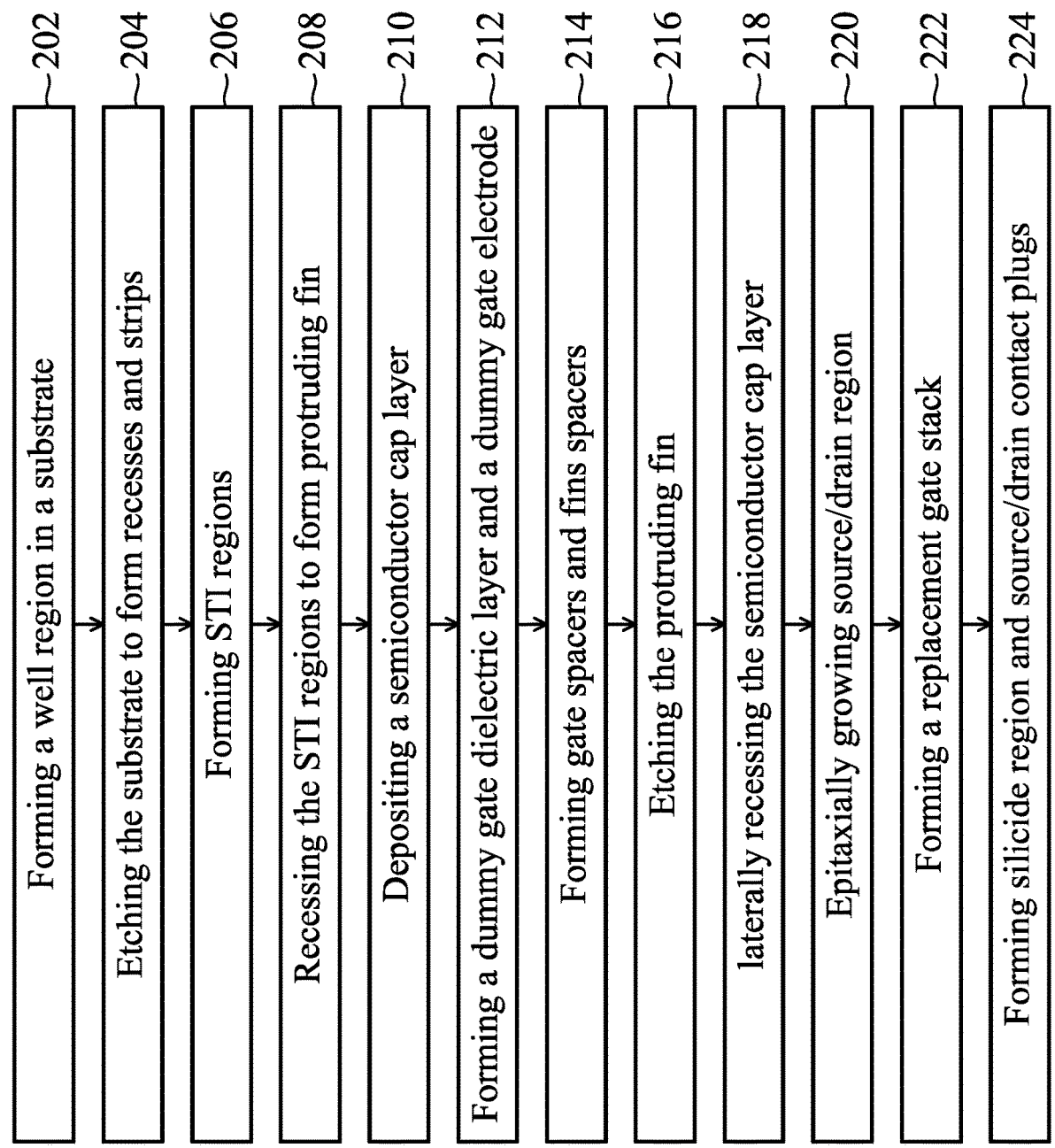
FIG. 14 illustrates a process flow for forming a FinFET in accordance with some embodiments.

FIG. 13 illustrates the subsequent processes, which include replacing dummy gate stacks 48 (FIG. 12A) with replacement gate stacks, forming source/drain silicide regions, and forming source/drain contact plugs. As shown in FIG. 13, replacement gate stacks 80 are formed, which include gate dielectrics 64 and gate electrodes 70. The respective process is illustrated as process 222 in the process flow 200 as shown in FIG. 14. The formation of gate stacks 80 includes forming/depositing a plurality of layers, and then performing a planarization process such as a CMP process or a mechanical grinding process. In accordance with some embodiments of the present disclosure, gate dielectrics 64 include Interfacial Layers (ILs) 61 as their lower parts. ILs 61 are formed on the exposed surfaces of protruding fins 36. ILs 61 may include an oxide layer such as a silicon oxide layer, which is formed through the thermal oxidation of protruding fin 36, a chemical oxidation process, or a deposition process. Gate dielectrics 64 may also include high-k dielectric layers 63 formed over ILs 61. High-k dielectric layers 63 may include a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. High-k dielectric layers 63 are formed as conformal layers, and extend on the sidewalls of protruding fin 36 and the sidewalls of gate spacers 50. In accordance with some embodiments of the present disclosure, high-k dielectric layers 63 are formed using ALD or CVD.

Gate electrodes 70 may include a plurality of sub-layers, which may include adhesion layer 72 (TiN, for example), work-function layer 74, and additional conductive materials and layers 76.

FIG. 13 also illustrates the formation of source/drain silicide regions 82 and source/drain contact plugs 84. The respective process is illustrated as process 224 in the process flow 200 as shown in FIG. 14. To form these features, contact openings are first formed by etching into ILD 62 and CESL 60 to reveal source/drain regions 58. Silicide regions 82 and source/drain contact plugs 84 are then formed to extend into ILD 62 and CESL 60. The formation process may include depositing a metal layer into the contact plugs, performing an anneal to react the metal layer and source/drain regions 58 to form silicide regions 82, and filling the remaining portions of the contact openings with conductive materials such as tungsten or cobalt to form contact plugs 84. FinFETs 86 are thus formed, which may be p-type FinFETs in accordance with some embodiments. In accordance with alternative embodiments of the present disclosure, FinFETs 86 are n-type FinFETs.

The embodiments of the present disclosure have some advantageous features. By recessing the semiconductor cap layers (such as the silicon cap layers) formed on semiconductor fins, the interface area between epitaxy source/drain regions and the channel regions of the resulting FinFET is increased. Since the epitaxy source/drain regions are doped more heavily with p-type or n-type impurities than the semiconductor cap layers, the contact resistance between the epitaxy source/drain regions and the semiconductor fins is lower than the contact resistance between the semiconductor cap and the semiconductor fins. The current crowding effect is reduced.

In accordance with some embodiments of the present disclosure, a method of forming an integrated circuit structure includes forming a semiconductor fin protruding higher than top surfaces of isolation regions on opposite sides of the semiconductor fin, wherein a top portion of the semiconductor fin is formed of a first semiconductor material; depositing a semiconductor cap layer on a top surface and sidewalls of the semiconductor fin, wherein the semiconductor cap layer is formed of a second semiconductor material different from the first semiconductor material; forming a gate stack on the semiconductor cap layer; forming a gate spacer on a sidewall of the gate stack; etching a portion of the semiconductor fin on a side of the gate stack to form a first recess extending into the semiconductor fin; recessing the semiconductor cap layer to form a second recess directly underlying a portion of the gate spacer; and performing an epitaxy to grow an epitaxy region extending into both the first recess and the second recess. In an embodiment, the first semiconductor material comprises silicon germanium, and the depositing the semiconductor cap layer comprises growing a silicon layer. In an embodiment, in the recessing the semiconductor cap layer, the semiconductor fin and the gate spacer are not etched. In an embodiment, the recessing the semiconductor cap layer comprises an isotropic etching process. In an embodiment, the isotropic etching process comprises a dry etching process. In an embodiment, the method further includes performing a wet cleaning process before the recessing the semiconductor cap layer, wherein the wet cleaning process and the recessing the semiconductor cap layer are different processes. In an embodiment, the method further includes etching a portion of a semiconductor strip between the isolation regions; and filling a space left by the etched portion of the semiconductor strip with the first semiconductor material; and recessing the isolation regions, wherein the first semiconductor material protrudes higher than remaining portions of the isolation regions. In an embodiment, the semiconductor cap layer is formed as an intrinsic layer.

In accordance with some embodiments of the present disclosure, a method of forming an integrated circuit structure includes forming a semiconductor fin, wherein a top portion of the semiconductor fin comprises silicon germanium; depositing a silicon cap layer on the semiconductor fin; forming a dummy gate stack on the silicon cap layer; forming a gate spacer on a sidewall of the gate stack; performing a first etching process to etch the silicon cap layer and a portion of the semiconductor fin, wherein a first recess is formed on a side of the semiconductor fin; performing a second etching process to etch a portion of the silicon cap layer directly underlying the gate spacer; and performing an epitaxy to grow an epitaxy region from the semiconductor fin and the silicon cap layer. In an embodiment, the silicon cap layer is deposited as an intrinsic layer. In an embodiment, the semiconductor fin has a first n-type impurity concentration, and the silicon cap layer has a second n-type impurity concentration lower than the first n-type impurity concentration, and the epitaxy region is of p-type. In an embodiment, before the second etching process, an edge of the silicon cap layer is flush with an edge of the semiconductor fin, and after the second etching process, the silicon cap layer is recessed more than the edge of the semiconductor fin. In an embodiment, in the second etching process, the silicon cap layer is recessed by a distance greater than about 1 nm. In an embodiment, the second etching process comprises an isotropic dry etching process.

In accordance with some embodiments of the present disclosure, an integrated circuit device includes isolation regions; a semiconductor fin protruding higher than portions of the isolation regions on opposite sides of the semiconductor fin, wherein a top portion of the semiconductor fin is formed of silicon germanium; a silicon cap layer on the semiconductor fin; a gate stack on the silicon cap layer; a gate spacer on a sidewall of the gate stack, wherein the gate spacer comprises an inner sidewall contacting the gate stack, and an outer sidewall opposite to the inner sidewall, wherein an edge of the silicon cap layer on a same side of the gate stack as the gate spacer is recessed more toward the gate stack than the outer sidewall of the gate spacer; and a source/drain region contacting the semiconductor fin and the edge of the silicon cap layer. In an embodiment, the semiconductor fin is of n-type, and the silicon cap layer has a lower n-type impurity concentration than the semiconductor fin. In an embodiment, the silicon cap layer is recessed more toward the gate stack than the outer sidewall of the gate spacer by a distance greater than about 1 nm. In an embodiment, the silicon cap layer is recessed more toward the gate stack than an interface between the semiconductor fin and the source/drain region, wherein the interface is measured at a level close to, and lower than, a top surface of the semiconductor fin. In an embodiment, the edge of the silicon cap layer is overlapped by a portion of the gate spacer, and the portion of the gate spacer is between the outer edge and the inner edge of the gate spacer. In an embodiment, the edge of the silicon cap layer is recessed more toward the gate stack than the outer sidewall of the gate spacer by a recessing distance, and a ratio of the recessing distance to a thickness of the gate spacer is in a range between about 0.2 and about 1.0.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
   dielectric isolation regions;
   a semiconductor fin protruding higher than portions of the dielectric isolation regions on opposite sides of the semiconductor fin;
   a silicon cap layer on, and directly contacting both of a top surface and sidewalls of, the semiconductor fin;
   a gate stack on the silicon cap layer;
   a gate spacer on a sidewall of the gate stack, wherein the gate spacer comprises an inner sidewall contacting the gate stack, and an outer sidewall opposite to the inner sidewall, wherein an edge of the silicon cap layer is recessed in a direction more toward the a center of the gate stack than the outer sidewall of the gate spacer, and wherein the edge of the silicon cap layer and the gate spacer are on a same side of the gate stack, and wherein in a top view of the gate spacer and the gate stack, the direction points from the outer sidewall to the inner sidewall, and the direction is perpendicular to a longitudinal direction of the gate spacer in the top view; and
   a source/drain region contacting the semiconductor fin and the edge of the silicon cap layer.

2. The integrated circuit device of claim 1, wherein the semiconductor fin is of n-type, and the silicon cap layer has a first germanium atomic percentage lower than a second germanium atomic percentage in the semiconductor fin.

3. The integrated circuit device of claim 1, wherein the semiconductor fin is of a conductivity type selected from p-type or n-type, and wherein the silicon cap layer has a lower impurity concentration of the conductivity type than the semiconductor fin.

4. The integrated circuit device of claim 1, wherein the silicon cap layer is recessed more toward the center of the gate stack than the outer sidewall of the gate spacer by a recessing distance greater than about 1 nm.

5. The integrated circuit device of claim 1, wherein the silicon cap layer comprises:
   a horizontal portion contacting the semiconductor fin to form a horizontal interface; and
   vertical portions contacting the gate stack to form vertical interfaces, wherein the horizontal portion and the vertical portions comprise are same as each other.

6. The integrated circuit device of claim 1, wherein the silicon cap layer is recessed more toward the gate stack than an interface between the semiconductor fin and the source/drain region.

7. The integrated circuit device of claim 1, wherein the edge of the silicon cap layer is overlapped by a portion of the gate spacer, and the portion of the gate spacer is between the outer sidewall and the inner sidewall of the gate spacer.

8. The integrated circuit device of claim 1, wherein the source/drain region contacts the silicon cap layer to form a vertical interface that comprises:
   an upper portion; and
   a lower portion lower than the upper portion, wherein the lower portion laterally extends beyond the outer sidewall of the gate spacer more than the upper portion.

9. An integrated circuit device comprising:
   a bulk semiconductor substrate;
   dielectric isolation regions in the bulk semiconductor substrate;
   a semiconductor region over the bulk semiconductor substrate, wherein the semiconductor region is between, and higher than, opposing parts of the dielectric isolation regions;
   a gate stack on the semiconductor region, the gate stack comprising a gate dielectric;
   a gate spacer on a sidewall of the gate stack;
   a silicon cap layer between, and contacting both of, the semiconductor region and the gate stack, wherein the silicon cap layer directly contacts both of a top surface and sidewalls of the semiconductor region; and
   a source/drain region contacting both of the semiconductor region and the silicon cap layer, wherein the silicon cap layer forms a vertical interface with the source/drain region, and a part of the vertical interface is directly underlying the gate spacer, and is laterally recessed more toward a center of the gate stack than an outer sidewall of the gate spacer, and wherein the vertical interface comprises:
   an upper portion; and
   a lower portion lower than the upper portion, wherein the lower portion laterally extends beyond the outer sidewall of the gate spacer more than the upper portion.

10. The integrated circuit device of claim 9, wherein the silicon cap layer has a lower germanium atomic percentage than the semiconductor region.

11. The integrated circuit device of claim 9, wherein the lower portion of the vertical interface extends laterally beyond the outer sidewall of the gate spacer.

12. The integrated circuit device of claim 9, wherein the part of the vertical interface is laterally recessed more toward the center than the outer sidewall of the gate spacer by a recessing distance greater than about 1 nm.

13. The integrated circuit device of claim 9, wherein the part of the vertical interface is laterally recessed more toward the center than the outer sidewall of the gate spacer by a recessing distance, and wherein a ratio of the recessing distance to a thickness of the gate spacer is in a range between about 0.2 and about 1.0.

14. The integrated circuit device of claim 9, wherein the semiconductor region has a first n-type impurity concentration, and the silicon cap layer has a second n-type impurity concentration lower than the first n-type impurity concentration, and the source/drain region is of p-type.

15. An integrated circuit device comprising:
   a bulk semiconductor substrate;
   dielectric isolation regions in the bulk semiconductor substrate;
   a semiconductor region over the bulk semiconductor substrate, wherein the semiconductor region is between, and higher than, opposing parts of the dielectric isolation regions;
   a gate stack over the semiconductor region, the gate stack comprising a gate dielectric;
   a gate spacer on a sidewall of the gate stack, wherein the gate spacer comprises an inner sidewall contacting the gate stack, and an outer sidewall opposing the inner sidewall;

a silicon cap layer comprising a top portion between and directly contacting the semiconductor region and the gate stack, and sidewall portions directly contacting sidewalls of the semiconductor region, wherein a bottom surface of the top portion of the silicon cap layer contacts a top surface of the semiconductor region to form a horizontal interface, and the horizontal interface is laterally recessed from a corresponding edge of the gate dielectric in a direction, with the gate dielectric overlapping the horizontal interface, and wherein in a top view of the gate spacer and the gate stack, the direction points from the outer sidewall to the inner sidewall, and the direction is perpendicular to a longitudinal direction of the gate spacer in the top view; and a source/drain region contacting the semiconductor region and silicon cap layer.

16. The integrated circuit device of claim 15, wherein one of the sidewall portions of the silicon cap layer physically contacts the gate stack to form a vertical interface.

17. The integrated circuit device of claim 16, wherein the vertical interface further comprises a portion laterally recessed from the corresponding edge of the gate dielectric.

18. The integrated circuit device of claim 16, wherein the silicon cap layer has a lower germanium atomic percentage than the semiconductor region.

19. The integrated circuit device of claim 16, wherein the horizontal interface is laterally recessed from the corresponding edge of the gate dielectric by a recessing distance greater than about 1 nm.

20. The integrated circuit device of claim 15, wherein the source/drain region contacts the silicon cap layer to form a vertical interface that comprises:

an upper portion; and a lower portion lower than the upper portion, wherein the lower portion laterally extends beyond the outer sidewall of the gate spacer more than the upper portion.

* * * * *